(12) United States Patent
Fukushima

(10) Patent No.: US 9,864,248 B2
(45) Date of Patent: Jan. 9, 2018

(54) SEMICONDUCTOR DEVICE AND DISPLAY DEVICE

(71) Applicant: Sharp Kabushiki Kaisha, Osaka (JP)

(72) Inventor: Yasumori Fukushima, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 15/107,897

(22) PCT Filed: Sep. 8, 2014

(86) PCT No.: PCT/JP2014/073642
§ 371 (c)(1),
(2) Date: Jun. 23, 2016

(87) PCT Pub. No.: WO2015/098192
PCT Pub. Date: Jul. 2, 2015

(65) Prior Publication Data
US 2016/0341997 A1 Nov. 24, 2016

(30) Foreign Application Priority Data
Dec. 27, 2013 (JP) .................................. 2013-272791

(51) Int. Cl.
*G02F 1/1368* (2006.01)
*H01L 51/10* (2006.01)
(Continued)

(52) U.S. Cl.
CPC .......... *G02F 1/1368* (2013.01); *H01L 51/105* (2013.01); *H01L 27/283* (2013.01);
(Continued)

(58) Field of Classification Search
CPC ................. G02F 1/1368; H01L 51/105; H01L 2251/301; H01L 51/0541; H01L 51/0545; H01L 27/283
See application file for complete search history.

(56) References Cited

U.S. PATENT DOCUMENTS

2007/0275500 A1* 11/2007 Suwa ................... H01B 1/02
438/99
2012/0248451 A1* 10/2012 Sone .................. H01L 29/4908
257/59
2013/0009135 A1 1/2013 Katsuhara

FOREIGN PATENT DOCUMENTS

JP  2006-147613 A  6/2006
JP  2006-302925 A  11/2006
(Continued)

*Primary Examiner* — Donald Raleigh
*Assistant Examiner* — Kevin Quarterman
(74) *Attorney, Agent, or Firm* — Chen Yoshimura LLP

(57) ABSTRACT

An aim of the present invention is to reduce manufacturing costs and lower the electrical resistance of composite metal electrodes while lowering the contact resistance of the composite metal electrodes with respect to an organic semiconductor film. A TFT (semiconductor device) of the present invention includes an organic semiconductor film formed from an organic semiconductor material, and a source electrode and a drain electrode that are composite metal electrodes that contact the organic semiconductor film. The source electrode and the drain electrode are configured such that a low-resistance metal material that makes ohmic contact with the organic semiconductor film, the contact resistance thereof being lower than that of a base metal material formed of a metal material, is mixed with the base metal material, and the low-resistance metal material is disposed so as to be exposed at least at a contact surface with the organic semiconductor film.

15 Claims, 23 Drawing Sheets

(51) Int. Cl.
    *H01L 27/28* (2006.01)
    *H01L 51/05* (2006.01)
(52) U.S. Cl.
    CPC ...... *H01L 51/0541* (2013.01); *H01L 51/0545* (2013.01); *H01L 2251/301* (2013.01)

(56) References Cited

FOREIGN PATENT DOCUMENTS

| | | |
|---|---|---|
| JP | 2006-319102 A | 11/2006 |
| JP | 2007-305839 A | 11/2007 |
| JP | 2012-74683 A | 4/2012 |
| JP | 2013-16613 A | 1/2013 |

* cited by examiner

SEMICONDUCTOR DEVICE AND DISPLAY DEVICE

TECHNICAL FIELD

The present invention relates to a semiconductor device and a display device.

BACKGROUND ART

In recent years, flat display panels such as liquid crystal panels and plasma display panels have been increasingly used as display elements for image display devices such as television receivers instead of conventional cathode-ray tubes, allowing for image display devices to be made thinner. In display panels used in such image display devices, a plurality of TFTs are provided in rows and columns as switching elements for controlling the operation of respective pixels. Conventionally, silicon semiconductors made of materials such as amorphous silicon and polycrystalline silicon were generally used for semiconductor films included in the TFTs. In recent years, however, it has been proposed that organic semiconductor films made of organic materials be used for the semiconductor films. Since organic semiconductor films can be formed at low temperatures, it is possible to form the films via a low cost coating process such as spin coating, and it is also possible to use a flexible substrate such as a plastic substrate, for example, in the device; thus, such a film is suitable for a flexible image display device. Patent Documents 1 and 2 disclose examples of semiconductor devices that use such an organic semiconductor film.

RELATED ART DOCUMENTS

Patent Documents

Patent Document 1: Japanese Patent Application Laid-Open Publication No. 2006-147613
Patent Document 2: Japanese Patent Application Laid-Open Publication No. 2006-302925

Problems to be Solved by the Invention

Patent Document 1 discloses an organic TFT in which a source electrode and a drain electrode are respectively formed of: an adhesive layer that is formed of a metal having good adhesiveness with respect to a gate insulating film; and an ohmic contact layer that covers the adhesive layer in a contact region with a current path and forms ohmic contact with a semiconductor layer. Meanwhile, Patent Document 2 discloses an organic field effect transistor where a source electrode and a drain electrode, in which electric charges are transferred via an organic semiconductor material layer, are formed of a mixture of a conductive polymeric material and a charge-transfer complex. Patent Document 2 also discloses an organic field effect transistor where a source electrode and a drain electrode are formed of a conductive layer and a conductive coating layer, of which the conductive coating layer is formed of a mixture of a conductive polymeric material and a charge-transfer complex.

However, there was a problem with the configuration disclosed in Patent Document 1 in that, while excellent ohmic contact with the organic semiconductor film was achieved via the ohmic contact layer, the ohmic contact layer was made of material chosen from among gold, platinum, palladium, or the like, leading to higher manufacturing costs.

Meanwhile, in the configuration disclosed in Patent Document 2, while excellent ohmic contact with the organic semiconductor film was achieved via the source electrode and the drain electrode being formed of a mixture of the conductive polymeric material and the charge-transfer complex, the electrical resistance of the source electrode and drain electrode was higher compared to instances in which a metal material is used. In addition, there was a problem with the configuration disclosed in Patent Document 2 in that, while the electrical resistance of the source electrode and the drain electrode was lowered and excellent ohmic contact with the organic semiconductor film was achieved via the source electrode and the drain electrode being formed of the conductive layer and the conductive coating layer, the conductive layer was made of a material chosen from among gold, platinum, palladium, or the like, thus naturally leading to higher manufacturing costs.

SUMMARY OF THE INVENTION

The present invention was made in view of the above-mentioned situation, and an aim thereof is to decrease the electrical resistance of the composite metal electrodes and reduce manufacturing costs while lowering contact resistance of composite metal electrodes with respect to an organic semiconductor film.

Means for Solving the Problems

A semiconductor device of the present invention includes: an organic semiconductor film formed of an organic semiconductor material; and composite metal electrodes that contact the organic semiconductor film, wherein the composite metal electrodes are each made of a low-resistance metal material mixed with a base metal material, the low-resistance metal material making ohmic contact with the organic semiconductor film and having a contact resistance lower than that of the base metal material, the low-resistance metal material being exposed at least at a contact surface with the organic semiconductor film.

In this manner, since the composite metal electrodes that contact the organic semiconductor film are configured such that: a low-resistance metal material that makes ohmic contact with an organic semiconductor film, the contact resistance thereof being lower than that of a base metal material formed of a metal material, is mixed with the base metal material, and the low-resistance metal material is exposed at least at the contact surface with the organic semiconductor film, it is possible to cause the composite metal electrodes to make excellent ohmic contact with the organic semiconductor film while having a sufficiently low contact resistance, and to keep the electrical resistance of the composite metal electrodes themselves low. In addition, taking into account that the material cost of the low-resistance metal material is generally higher than that of the base metal material, it is possible to lower manufacturing costs since the amount of low-resistance metal material used in the present configuration is lower than in a configuration in which the composite metal electrodes are formed of only the low-resistance metal material.

The following configurations are preferred embodiments of a semiconductor device of the present invention.

(1) The base metal material has a film shape, and at least an end face along a thickness direction thereof is the contact surface, and the low-resistance metal material is formed of a plurality of flat metal pieces contained within the base metal material, and the metal pieces are disposed such that a flat surface thereof is orthogonal to the end face. By using such a configuration, the low-resistance metal material is formed of a plurality of flat metal pieces contained within the base metal material, and a flat surface thereof intersects an end face along the thickness direction of the film-shaped base metal material; thus, it becomes easier for the metal pieces to be exposed to the end face of the base metal material. As a result, since the metal pieces efficiently contact the organic semiconductor film, it is possible to sufficiently lower the contact resistance of the composite metal electrodes with respect to the organic semiconductor film even if manufacturing costs are lowered by reducing the metal piece content, for example.

(2) The composite metal electrodes are each configured such that the low-resistance metal material is also exposed at a non-contact surface that does not contact the organic semiconductor film. In such a configuration, compared to a configuration in which the low-resistance metal material is disposed so as to be selectively exposed at only the contact surface with the organic semiconductor film, it is not necessary to cause the arrangement of the low-resistance metal material to be selective. Thus, since it is easy to form the composite metal electrodes during manufacturing, it is possible to further reduce manufacturing costs.

(3) The composite metal electrodes are each formed by forming a low-resistance metal-based layer in which a relatively large amount of the low-resistance metal material is disposed, and a base metal-based layer in which a relatively large amount of the base metal material is disposed. In such a configuration, compared to a case in which the low-resistance metal material is evenly dispersed within the base metal material, the low-resistance metal material is more reliably exposed, in the low-resistance metal-based layer of the composite metal electrodes, to the contact surface of the composite metal electrode with the organic semiconductor film. As a result, since the low-resistance metal material efficiently contacts the organic semiconductor film, it is possible to sufficiently lower the contact resistance of the composite metal electrodes with respect to the organic semiconductor film even if manufacturing costs are lowered by reducing the amount of low-resistance metal material, for example.

(4) At least a portion of the organic semiconductor film is formed on an underlying surface on which the composite metal electrodes are formed, a film thickness thereof being thinner than a thickness of the composite metal electrodes, and the composite metal electrodes are each configured such that the low-resistance metal-based layer is disposed along the underlying surface in a film thickness direction of the organic semiconductor film. In such a configuration, electric charges are mainly exchanged between the organic semiconductor film and the portions of the composite metal electrodes closest to the underlying surface. Therefore, since the low-resistance metal-based layer is disposed in the composite metal electrodes towards the underlying surface in the thickness direction of the organic semiconductor film, electric charges will be more smoothly exchanged between the organic semiconductor film and the composite metal electrodes. As a result, it is possible to sufficiently lower the contact resistance of the composite metal electrodes with respect to the organic semiconductor film.

(5) The composite metal electrodes are each configured such that a content ratio of the low-resistance metal material is within a range of 1% to 30%. In general, the low-resistance metal material has higher material costs compared to the base metal material. If the content ratio of the low-resistance metal material is below 1%, there is a tendency for the contact resistance of the composite metal electrodes with respect to the organic semiconductor film to become too large. Conversely, if the content ratio of the low-resistance metal material is greater than 30%, there is a tendency for manufacturing costs to become too high since a larger amount of low-resistance metal material is used. Therefore, by having the content ratio of the low-resistance metal material be between 1% and 30%, it is possible to sufficiently lower the contact resistance of the composite metal electrodes with respect to the organic semiconductor film, and it is also possible to reduce manufacturing costs since the amount of low-resistance metal material that is used is kept low.

(6) The semiconductor device further includes: a substrate; a substrate; a gate electrode formed on the substrate; and an insulating film formed on a side of the gate electrode opposite to the substrate, wherein the organic semiconductor film is formed on a side of the insulating film opposite to the substrate, and is disposed so as to coincide in position with the gate electrode, and wherein the composite metal electrodes include a source electrode and a drain electrode that are disposed with a gap therebetween and that are formed on the side of the insulating film opposite to the substrate. In such a configuration, when voltage is applied to the gate electrode formed on the substrate, an electric field is applied to the organic semiconductor film that overlaps the gate electrode via the gate insulating film; thus, electric charges are transferred between the source electrode and the drain electrode, which form the composite metal electrodes, via the organic semiconductor film. Since the respective electrodes and the gate insulating film are not disposed on the side of the organic semiconductor film that is opposite to the substrate, it is possible to prevent the organic semiconductor film from being affected by heat generated when the respective electrodes are formed during the manufacturing process.

(7) The semiconductor device further includes: a substrate on which the organic semiconductor film and the composite metal electrodes are formed; an insulating film formed on a side of the organic semiconductor film and the composite metal electrodes opposite to the substrate; and a gate electrode formed on a side of the insulating film opposite to the substrate, wherein the organic semiconductor film is disposed so as to coincide in position with the gate electrode, and wherein the composite metal electrodes include a source electrode and a drain electrode that are disposed with a gap therebetween. In such a configuration, when voltage is applied to the gate electrode formed on the side of the gate insulating film that is opposite to the substrate, an electric field is applied to the organic semiconductor film that overlaps the gate electrode via the gate insulating film; thus, electric charges are transferred between the source electrode and the drain electrode, which form the composite metal electrodes, via the organic semiconductor film. Depending on the type of organic semiconductor material used in the organic semiconductor film, there may be instances in which a layer with excellent electrical conductivity may form in the portion of the organic semiconductor film that is opposite to the substrate in the thickness direction thereof. In such a case, the layer with excellent electrical conductivity is disposed in the organic semiconductor film closer to the gate electrode compared to other portions of the film; thus, the semiconductor device will have excellent electrical properties.

(8) The semiconductor device further includes adhesive films respectively interposed between the composite metal electrodes and an underlying surface upon which the composite metal electrodes are formed, the adhesive films respectively adhering the composite metal electrodes to the underlying surface. In such a configuration, even in cases in which the base metal material and the low-resistance metal material that form the composite metal electrodes are materials that have poor adhesion with respect to the underlying surface, the adhesive film ensures that the composite metal electrodes will bond to the underlying surface.

(9) The organic semiconductor film includes a portion formed on an underlying surface on which the composite metal electrodes are formed, and portions respectively formed on a side of each of the composite metal electrodes opposite to the underlying surface, and the semiconductor device further includes a protective film formed on a side of the organic semiconductor film opposite to the underlying surface. In such a configuration, the organic semiconductor film has portions respectively formed on the side of the composite metal electrodes opposite to the underlying surface; thus, it is possible to prevent the organic semiconductor film from being affected by heat generated when the composite metal electrodes are formed during the manufacturing process. Furthermore, since the protective film is formed on the side of the organic semiconductor film opposite to the underlying surface, even in cases in which a different film is formed on the side of the protective film opposite to the organic semiconductor film and this film possesses the capability of damaging the organic semiconductor film, for example, it is unlikely that the organic semiconductor film will be damaged since the organic semiconductor film is protected by the protective film.

(10) The low-resistance metal material is any one of silver, gold, platinum, and palladium. In such a configuration, the low-resistance metal material makes excellent ohmic contact with the organic semiconductor film; thus, it is possible to more suitably lower the contact resistance of the composite metal electrodes with respect to the organic semiconductor film.

(11) The base metal material is any one of copper, aluminum, tungsten, molybdenum, cobalt, and nickel. In such a configuration, it is possible to keep the material costs of the composite metal electrodes low while also keeping the electrical resistance of the composite metal electrodes sufficiently low.

Next, in order to resolve the above-mentioned problems, a display device of the present invention includes a device substrate having as a switching element the above-mentioned semiconductor device.

In a display device with such a configuration, it is possible to obtain excellent display performance since the switching element has excellent electrical properties, and manufacturing costs will also be kept low.

A configuration that includes an opposite substrate facing the device substrate, and a liquid crystal layer sandwiched between the device substrate and the opposite substrate, is a preferred embodiment of a display device of the present invention. Such a display device can be used as a liquid crystal display device in a variety of applications such as smartphone and tablet PC displays, for example.

Effects of the Invention

According to the present invention, it is possible to lower the electrical resistance of the composite metal electrodes and to reduce manufacturing costs while lowering the contact resistance of the composite metal electrodes with respect to the organic semiconductor film.

DETAILED DESCRIPTION OF EMBODIMENTS

Embodiment 1

Embodiment 1 of the present invention will be described using FIGS. 1 to 12. In the present embodiment, a liquid crystal display device 10 will be described as an example. The drawings indicate an X axis, a Y axis, and a Z axis in a portion of the drawings, and each of the axes indicates the same direction in the respective drawings. The up-down direction is based on FIGS. 2 to 4 and the like, with the upper side thereof indicating the front side and the lower side thereof indicating the rear side.

Figure 1:
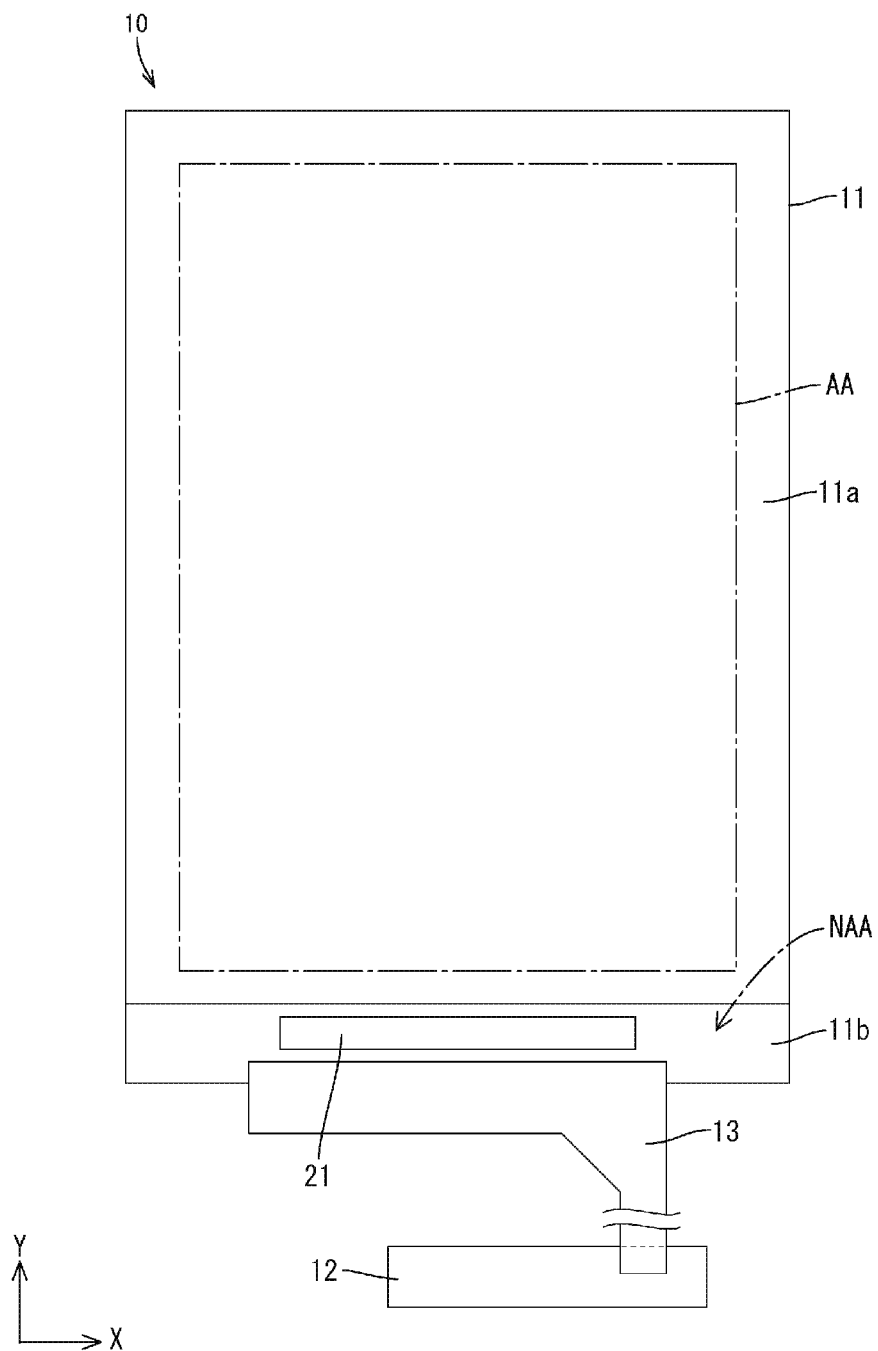
FIG. 1 is a schematic plan view that shows a connection configuration for a flexible substrate, a control circuit substrate, and a liquid crystal panel having a driver mounted thereon according to Embodiment 1 of the present invention.
Figure 2:
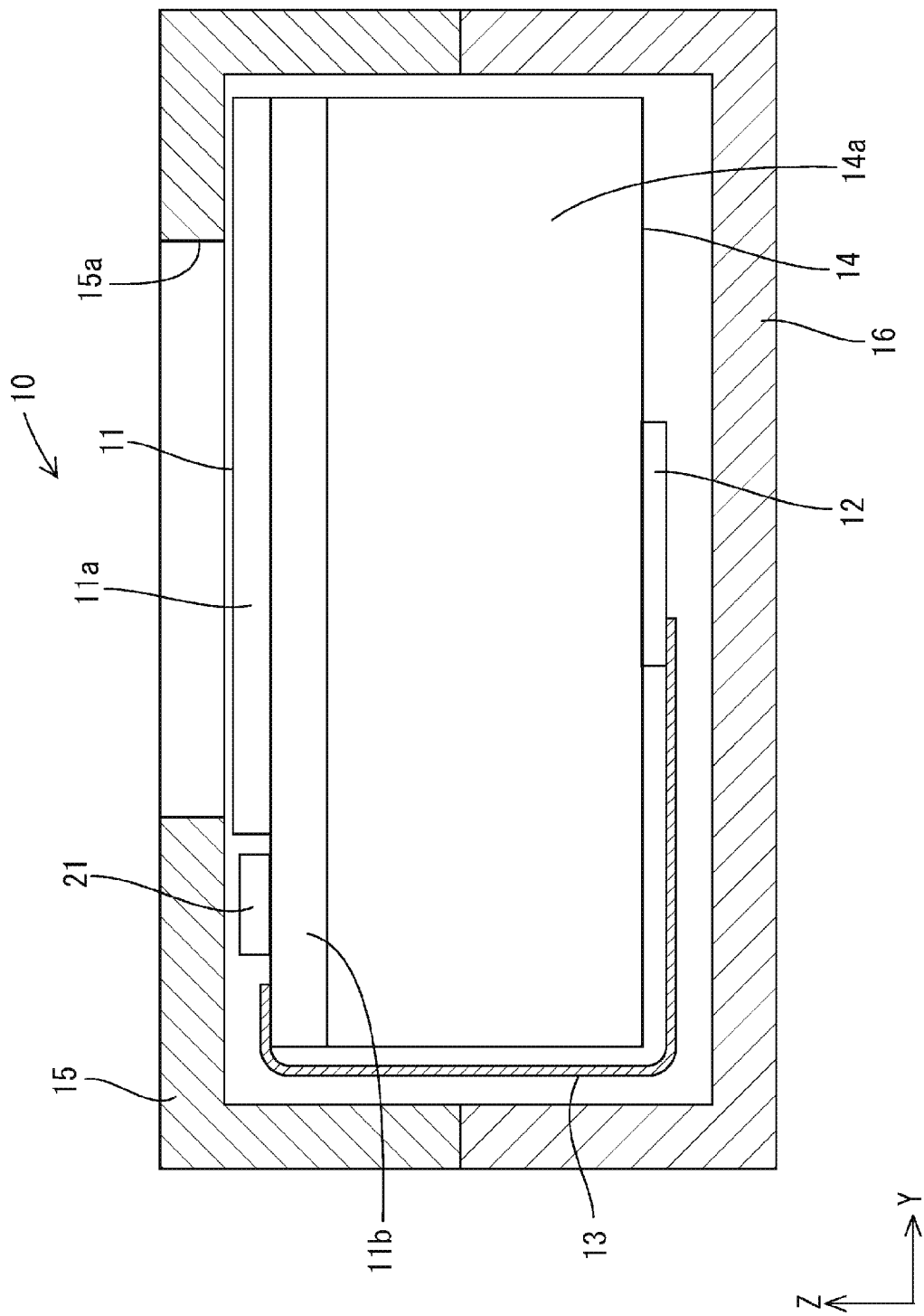
FIG. 2 is a schematic cross-sectional view that shows a cross-sectional configuration along a long side direction of a liquid crystal display device.

As shown in FIGS. 1 and 2, the liquid crystal display device 10 includes: a liquid crystal panel (display device, display panel) 11; a driver (panel driving unit) 21 that drives the liquid crystal panel 11; a control circuit substrate (external signal source) 12 that provides various external input signals to the driver 21; a flexible substrate (external connection component) 13 that electrically connects the liquid crystal panel 11 and the external control circuit substrate 12; and a backlight device (illumination device) 14 that is an external light source that provides light to the liquid crystal panel 11. The liquid crystal display device 10 further includes front and back exterior members 15, 16 for housing and holding the liquid crystal panel 11 and the backlight device 14 that are attached to each other. The front exterior member 15 has an opening 15a for making images displayed on the liquid crystal panel 11 visible to the outside. The liquid crystal display device 10 according to the present embodiment can be used in various electronic devices (not shown) such as portable information devices (including electronic books, PDAs, and the like), mobile telephones (including smartphones and the like), laptops (including tablet PCs and the like), digital photo frames, portable gaming devices, and electronic ink paper. Thus, the screen size of the liquid crystal panel 11 that forms a part of the liquid crystal display device 10 ranges from approximately several inches to a dozen or so inches, and is generally classified as either small or medium-small.

A simple description of the backlight device 14 will be given first. As shown in FIG. 2, the backlight device 14 includes: a substantially box-shaped chassis 14a with an opening in the front (facing the liquid crystal panel 11); light sources (cold cathode-ray tubes, LEDs, organic ELs, or the like, for example; not shown) disposed within the chassis 14a; and an optical member (not shown) disposed so as to cover the opening in the chassis 14a. The optical member performs functions such as converting light emitted from the light sources into planar light.

Next, a simple description of the liquid crystal panel 11 will be given. As shown in FIG. 1, the liquid crystal panel 11 has a vertically-long quadrilateral (rectangular) shape as a whole, and a display area (active area) AA that can display images is disposed in a location closer to one end (the top in FIG. 1) in the long-side direction of the panel. The driver 21 and the flexible substrate 13 are respectively attached in locations closer to the other end (the bottom in FIG. 1) in the long-side direction of the panel. On the liquid crystal panel 11, an area outside the display area AA is referred to as a non-display area (non-active area) NAA in which images are not displayed. Portions of this non-display area NAA are mounting regions for the driver 21 and the flexible substrate 13. The short-side direction of the liquid crystal panel 11 corresponds to the X axis direction in the various drawings, while the long-side direction thereof corresponds to the Y axis direction in the various drawings. In FIG. 1, a frame-shaped dashed-dotted line that is slightly smaller than a CF substrate 11a represents the shape of the display area AA, and the region to the outside of the dashed-dotted line is the non-display area NAA.

The components connected to the liquid crystal panel 11 will be described next. As shown in FIGS. 1 and 2, the control circuit substrate 12 is attached to the rear surface (the outer surface opposite to the liquid crystal panel 11) of the chassis 14a of the backlight device 14 via a screw or the like. The control circuit substrate 12 has an electronic component for providing various types of input signals to the driver 21 mounted on a phenolic paper or glass epoxy resin substrate, and wiring lines (conductive path; not shown) of a prescribed pattern are formed on the control circuit substrate 12. One end (one end side) of the flexible substrate 13 is electrically and mechanically connected to the circuit control substrate 12 via an ACF (anisotropic conductive film; not shown).

As shown in FIG. 2, the flexible substrate (FPC substrate) 13 includes a base material made of a composite resin material having insulating and flexible characteristics (a polyimide resin or the like, for example), and has a plurality of wiring patterns (not shown) on the base material. One end in the long-side direction of the flexible substrate 13 connects to the control circuit substrate 12 disposed on the rear of the chassis 14a in the manner described above, and the other end (the other end side) of the flexible substrate 13 is connected to an array substrate 11b of the liquid crystal panel 11; thus, the flexible substrate 13 is bent in a cuff shape such that, inside the liquid crystal display device 10, the flexible substrate 13 has a substantially U-shaped cross section. On both ends in the long-side direction of the flexible substrate 13, the wiring patterns are exposed to the outside and form terminals (not shown), and these terminals are respectively electrically connected to the control circuit substrate 12 and the liquid crystal panel 11. As a result, it is possible for input signals provided by the control circuit substrate 12 to be transmitted to the liquid crystal panel 11.

As shown in FIG. 1, the driver 21 is formed of an LSI chip having a driver circuit therein, and by operating in accordance with signals provided by the control circuit substrate 12, which is the signal source, the driver 21 generates output signals by processing the input signals provided by the control circuit substrate 12, which is the signal source, and outputs these output signals to the display area AA of the liquid crystal panel 11. The driver 21 has a horizontally-long quadrilateral shape in a plan view (forms a rectangular along the short-side of the liquid crystal panel 11) and is directly mounted on the non-display area NAA of the liquid crystal panel 11 (the array substrate 11b, which will be explained later). In other words, the driver 21 is mounted via COG (chip on glass) mounting. The long-side direction of the driver 21 corresponds to the X axis direction (the short-side direction of the liquid crystal panel 11), and the short-side direction thereof corresponds to the Y axis direction (the long-side direction of the liquid crystal panel 11).

Figure 3:
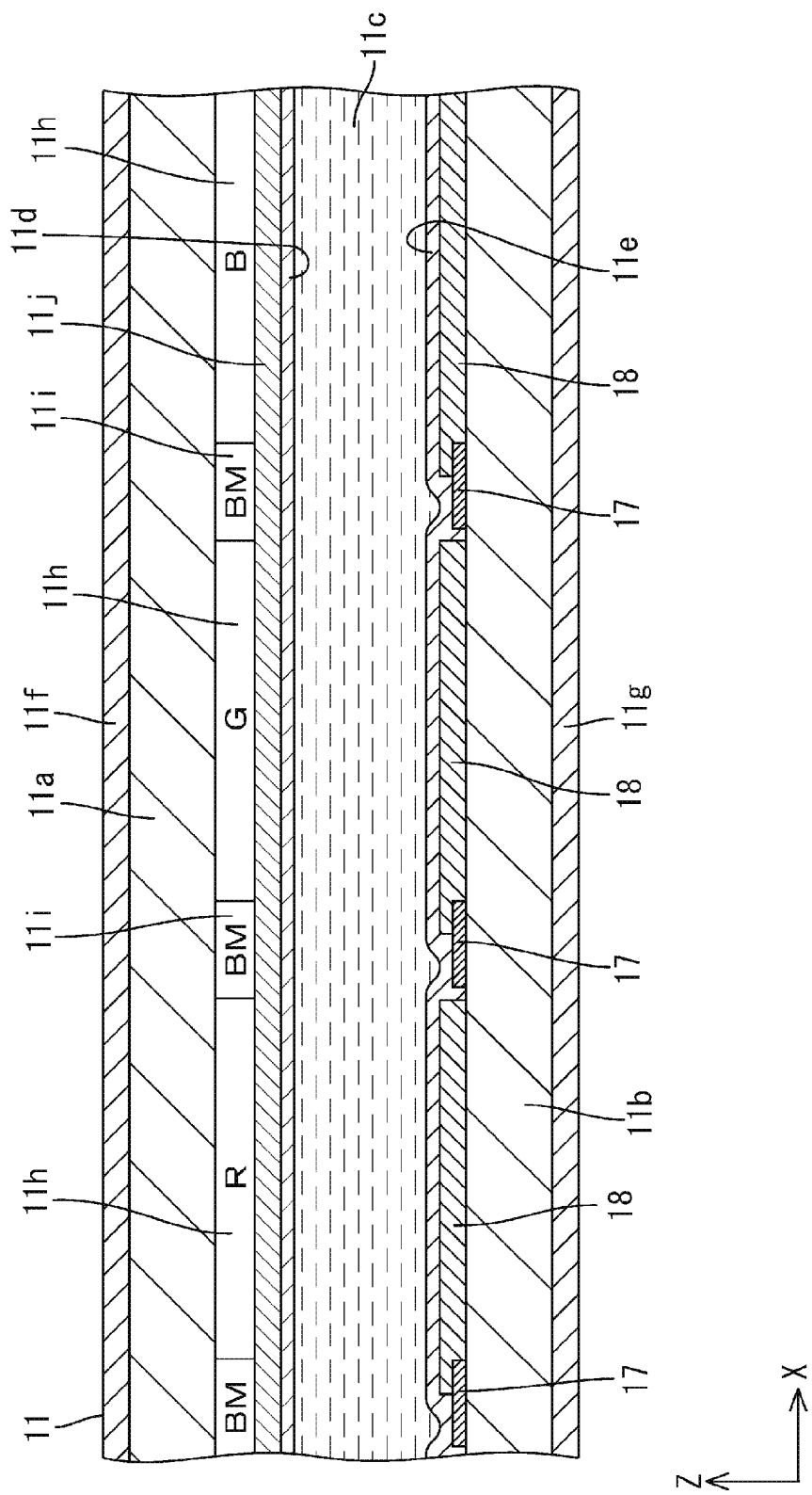
FIG. 3 is a schematic cross-sectional view that shows a cross-sectional configuration of the liquid crystal panel.

The liquid crystal panel 11 will once again be described. As shown in FIG. 3, the liquid crystal panel 11 includes a pair of transparent (having excellent light-transmitting properties) substrates 11a, 11b, and a liquid crystal layer 11c that is interposed between the two substrate 11a, 11b and that contains liquid crystal molecules in which the optical properties change in accordance with the application of an electric field. The substrates 11a, 11b are bonded via a sealant (not shown) so as to maintain a cell gap that corresponds to the thickness of the liquid crystal layer 11c. The substrates 11a, 11b are both formed of a synthetic resin material (for example, a polyethylene terephthalate resin, a polyethylene resin, a naphthalate resin, a polyether sulfone resin, a polypropylene resin, a polycarbonate resin, a polyester resin, a polyimide resin, or the like), for example, and the thickness thereof is thinner than that of a glass substrate; thus, the substrates are suitably flexible. Therefore, the liquid crystal panel 11 is a flexible display panel with a fixed flexibility, and even if the panel is warped such that the surface thereof becomes bent, for example, it is still possible to display images in the display area AA. Of the two substrates 11a, 11b, the CF substrate (opposite substrate) 11a is disposed to the front (front surface side), and the array substrate (device substrate, TFT substrate, active matrix substrate) 11b is disposed to the rear (rear surface side). As shown in FIGS. 1 and 2, the short-side dimension of the CF substrate 11a is substantially identical to that of the array substrate 11b, while the long-side dimension thereof is smaller than that of the array substrate 11b, and the CF substrate 11a is bonded to the array substrate 11b such that one end (the upper side in FIG. 1) in the long-side direction is aligned with the array substrate 11b. Therefore, the other end (the lower side in FIG. 1) in the long-side direction of the array substrate 11b does not overlap the CF substrate 11a over a prescribed range, and both the front and rear surfaces of the other end are exposed to the exterior, thus ensuring that there will be mounting regions in this area for the driver 21 and the flexible substrate 13. Alignment films 11d, 11e for aligning the liquid crystal molecules included in the liquid crystal layer 11c are respectively formed on the inner surfaces of the two substrates 11a, 11b. In addition, polarizing plates 11f, 11g are respectively bonded to the outer surfaces of the two substrates 11a, 11b.

Next, the components within the display area AA of the CF substrate 11a and the array substrate 11b will be sequentially described in detail. As shown in FIG. 3, a plurality of TFTs (thin film transistors) 17, which are semiconductor devices, and pixel electrodes 18 are arranged in a matrix on the inner surface (liquid crystal layer 11c side, side facing the CF substrate 11a) of the array substrate 11b. Source wiring lines (column control lines, data lines; not shown) and gate wiring lines (row control lines, scan lines; not shown) are arranged in a grid-like pattern so as to surround the TFTs 17 and the pixel electrodes 18e. In other words, the TFTs 17 and the pixel electrodes 18 are arranged in a matrix at the intersections of the gate wiring lines and the source wiring lines that form a grid. The gate wiring lines and the source wiring lines are respectively made from a metal material, and are disposed with a gate insulating film 23, which will be explained later, being interposed between the mutually intersecting portions thereof. The gate wiring lines and the source wiring lines are respectively connected to a gate electrode 17a and a source electrode 17b of the TFT 17, which will be explained later, and the pixel electrode 18 is connected to a drain electrode 17c of the TFT 17. In addition, the pixel electrode 18 has a vertically-long quadrilateral (rectangular) shape in a plan view, and is formed of a transparent electrode material such as ITO (indium tin oxide) or ZnO (zinc oxide). It is also possible to provide capacitance wiring lines (not shown), which are parallel to the gate wiring lines and that cross and overlap the pixel electrode 18 through the gate insulating film 23, on the array substrate 11b.

Meanwhile, as shown in FIG. 3, a color filter 11h, in which a plurality of respective colored portions such as R (red), G (green), and B (blue) are arranged in a matrix so as to overlap in a plan view the respective pixel electrodes 18 on the array substrate 11b side, is provided on the CF substrate 11a. A substantially grid-shaped light-shielding layer (black matrix) 11i for preventing colors from mixing is formed between the respective colored portions constituting the color filter 11h. This light-shielding layer 11i is disposed so as to overlap the gate wiring lines and the source wiring lines in a plan view. A uniformly-planar opposite electrode 11j that faces the pixel electrodes 18 on the array substrate 11b side is provided on the surface of the color filter 11h and the light-shielding layer 11i. In the liquid crystal panel 11, one display pixel, which is a display unit, is formed of a group of three colored portions (R (red), G (green), and B(blue)) and the three pixel electrodes 18 that face these colored portions. The display pixel is formed of a red pixel that has an R colored portion, a green pixel that has a G colored portion, and a blue pixel that has a B colored portion. These respective color pixels are aligned in a repeating manner along the row direction (X axis direction) on the surface of the liquid crystal panel 11 to form pixel groups, and a plurality of these pixel groups are arranged along the column direction (Y axis direction) of the liquid crystal panel 11.

Figure 4:
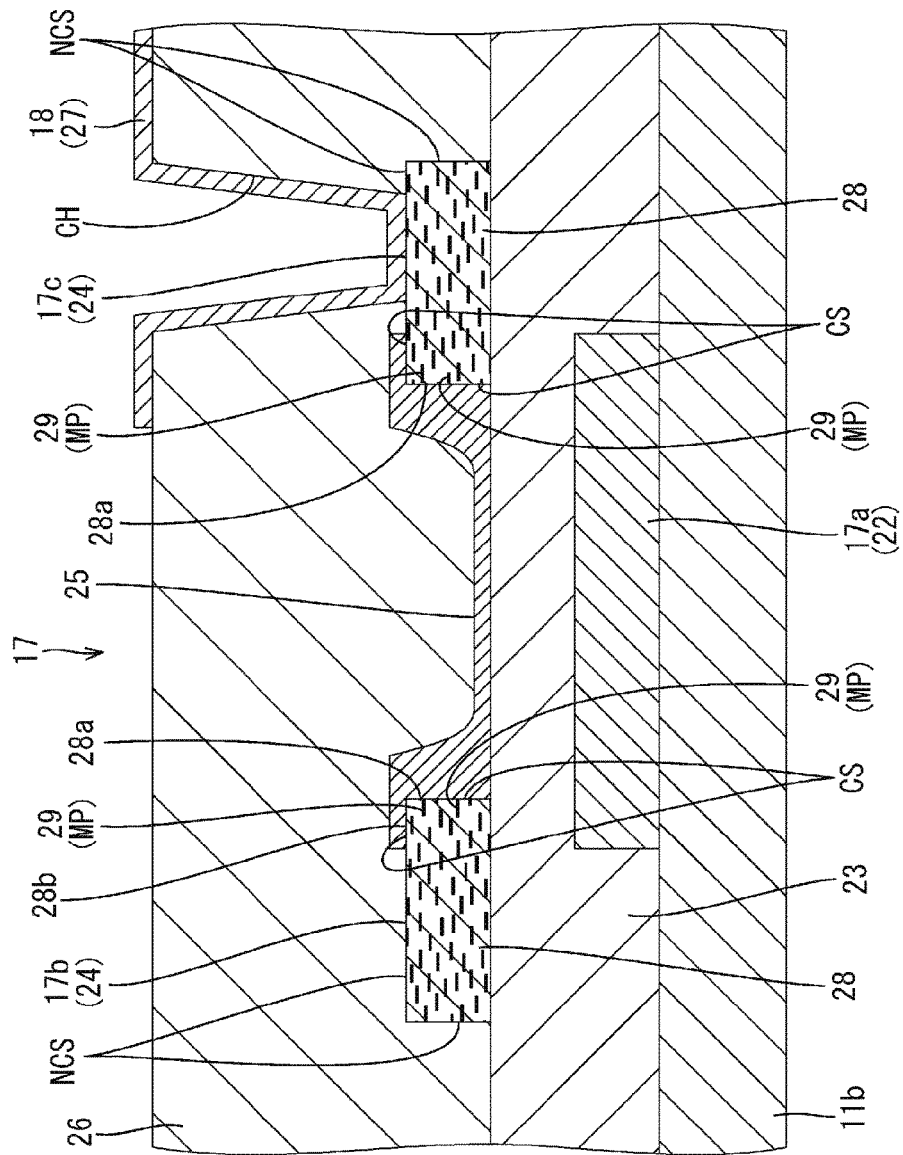
FIG. 4 is a cross-sectional view that shows a cross-sectional configuration of a TFT.

A plurality of films are formed on the inner surface side (the liquid crystal layer side 11c, the side facing the CF substrate 11a) of the array substrate 11b using the well-known photolithography method or the like. These films will be described next. As shown in FIG. 4, a first metal film 22, a gate insulating film (insulating film) 23, a second metal film 24, an organic semiconductor film 25, a planarizing film 26, and a transparent electrode film 27 are formed and formed in this order from bottom (the side closest to the array substrate 11b, the side furthest from the CF substrate 11a, the rear side) to top on the array substrate 11b. Also, while not shown in FIG. 4, an alignment film 11e that faces the liquid crystal layer 11c is disposed on top of the planarizing film 26 and the transparent electrode film 27 (see FIG. 3).

As shown in FIG. 4, the first metal film 22 is formed on top of the array substrate 11b and is a formed film formed by forming films of titanium (Ti), aluminum (Al), and titanium in this order from the bottom, for example (the respective formed films are not shown in the drawings). The first metal film 22 forms the gate wiring lines and the gate electrode 17a of the TFT 17, respectively. In the first metal film 22, the thickness of the bottom titanium layer is between 5 nm and 30 nm, for example, the thickness of the middle aluminum layer is between 100 nm and 400 nm, for example, and the thickness of the top titanium layer is between 30 nm and 100 nm, for example. The gate insulating film 23 is formed on top of the array substrate 11b and the first metal film 22, and is formed in a uniformly-planar pattern. The gate insulating film 23 is formed of an organic resin material such as a polyimide, a polystyrene, a polyvinyl phenol, or a fluoropolymer, for example. The organic resin material used in the gate insulating film 23 is photosensitive. The thickness of the gate insulating film 23 is between 100 nm and 1000 nm, for example. The second metal film 24 is formed on top of the gate insulating film 23, and forms the source wiring lines and the source electrode 17b and the drain electrode 17c of the TFT 17. Therefore, the surface of the gate insulating film 23 is the underlying surface on which the source electrode 17b and the drain electrode 17c are formed. The thickness of the second metal film 24 is between 100 nm and 400 nm, for example. The configuration of the source electrode 17b and the drain electrode 17c formed from the second metal film 24 will be described again later in more detail.

As shown in FIG. 4, the organic semiconductor film 25 is formed on top of a portion of the gate insulating film 23 and second metal film 24 (the source electrode 17b and the drain electrode 17c), and is patterned in an island shape in accordance with the planar arrangement of the TFT 17 within the plane of the array substrate 11b. The organic semiconductor film 25 is formed of an organic semiconductor material, and is specifically formed of an organic semiconductor material with a low molecular weight such as TIPS-pentacene, TES-pentacene, TES-ADT, or dif-TES, or a polymeric organic semiconductor material such as a polythiophene or a polyfluorene, or the like. Compared to silicon-based semiconductor materials, for example, the organic semiconductor material forming the organic semiconductor film 25 can be formed on the array substrate 11b using a lower temperature process. Thus, as in the present embodiment, this organic semiconductor material is suitable for a configuration in which the array substrate 11b is formed of a synthetic resin material which has a lower upper temperature limit than glass (glass transition point), or in other words, is suitable for the flexible liquid crystal panel 11. The organic semiconductor material forming the organic semiconductor film 25 can be dispersed within a solvent; thus, while it is possible to form the film on the array substrate 11b using a low-cost coating process (such as spin coating), it is also possible to form the film on the array substrate 11b using another method such as vacuum deposition. The thickness of the organic semiconductor film 25 is between 30 nm and 100 nm, for example, and it is preferable that this thickness be thinner than the thickness of the above-mentioned second metal film 24.

As shown in FIG. 4, the planarizing film 26 is formed on top of the gate insulating film 23, the second metal film 24, and the organic semiconductor film 25, and is formed in a uniformly-planar pattern. The planarizing film 26 is formed of an organic resin material such as a polyimide, a polystyrene, a polyvinyl phenol, or a fluoropolymer, for example. The organic resin material used in the planarizing film 26 is photosensitive. A plurality of contact holes CH are formed in the planarizing film 26 in accordance with the planar arrangement of the TFT 17 within the plane of the array substrate 11b. The thickness of the planarizing film 26 is between 1 μm and 3 μm, for example. The transparent electrode film 27 is formed on top of a portion of the planarizing film 26 and the second metal film 24 (the drain electrode 17c), and is patterned in an island shape in accordance with the planar arrangement of the TFT 17 within the plane of the array substrate 11b. The transparent electrode film 27 is formed from a transparent electrode material such as ITO (indium tin oxide) or ZnO (zinc oxide), for example. The transparent electrode film 27 forms the pixel electrode 18.

Here, the TFT 17 included in the array substrate 11b will be described in detail. As shown in FIG. 4, the TFT 17 includes: the gate electrode 17a formed from the first metal film 22 formed on the array substrate 11b; the source electrode 17b and the drain electrode 17c formed from the second metal film 24 formed on the gate insulating film 23; and the organic semiconductor film 25 formed on a portion of the gate insulating film 23, the source electrode 17b, and the drain electrode 17c. The TFT 17 is of a so-called "bottom gate" type (inverted staggered type). The organic semiconductor film 25 is formed so as to overlap a portion of the gate insulating film 23 sandwiched between the source electrode 17b and the drain electrode 17c, and overlap respective portions of the source electrode 17b and the drain electrode 17c that face each other. Since portions of the source electrode 17b and the drain electrode 17c are respectively in direct contact with the organic semiconductor film 25, it is possible for electric charges to be transferred between the source electrode 17b and the drain electrode 17c via the organic semiconductor film 25. In other words, the organic semiconductor film 25 forms the channel of the TFT 17. Furthermore, since the organic semiconductor film 25 is disposed so as to overlap the gate electrode 17a through the gate insulating film 23, when a voltage is applied to the gate electrode 17a, an electric field is applied to the organic semiconductor film 25, and it is therefore possible to control the electric charges transferred between the source electrode 17b and the drain electrode 17c via the organic semiconductor film 25. In addition, the pixel electrode 18 contacts the drain electrode 17c of the TFT 17 via the contact hole CH formed in the planarizing film 26. Therefore, when voltage is applied to the gate electrode 17a of the TFT 17, electric charges are transferred between the source electrode 17b and the drain electrode 17c via the organic semiconductor film 25 and a prescribed pixel potential is applied to the pixel electrode 18.

There was a problem with the organic semiconductor material used in the organic semiconductor film 25 in that the contact resistance with respect to the source electrode 17b and the drain electrode 17c formed of metal material tended to be higher than when a silicon-based semiconductor material was used. While it is preferable to use gold, platinum, or the like as the metal material of the source electrode 17b and the drain electrode 17c in order to reduce the contact resistance of the source electrode 17b and the drain electrode 17c with respect to the organic semiconductor film 25, the material costs of such metal materials are generally high, which leads to an increase in manufacturing costs. Meanwhile, while tests were conducted regarding using a mixture of a conductive polymeric material and a charge-transfer complex as the material of the source electrode 17b and the drain electrode 17c, the electrical resistance of the source electrode 17b and the drain electrode 17c themselves increased during these tests, resulting in a degradation of the electrical properties of the TFT 17.

Figure 5:
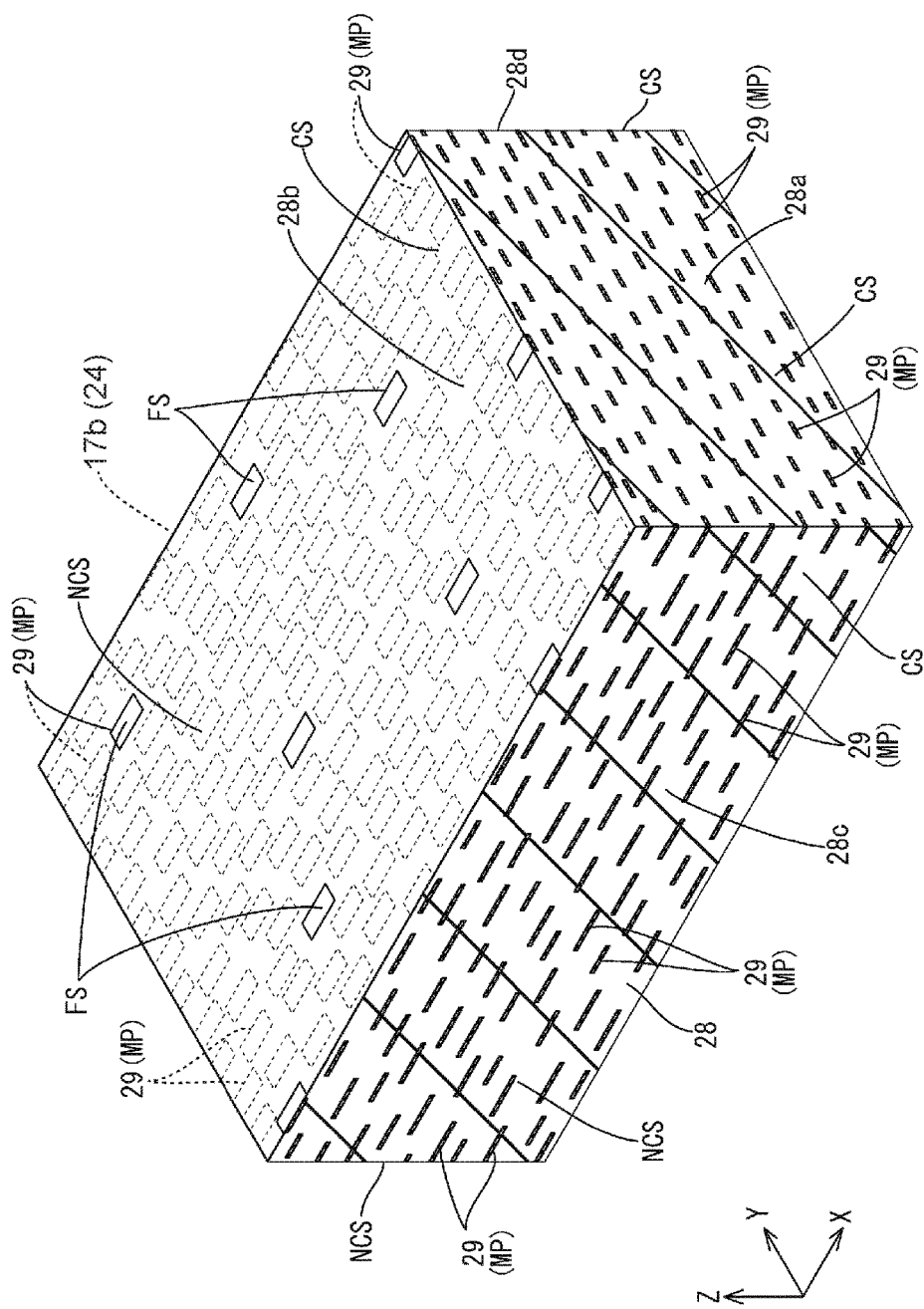
FIG. 5 is a perspective view of a source electrode that forms part of the TFT.
Figure 6:
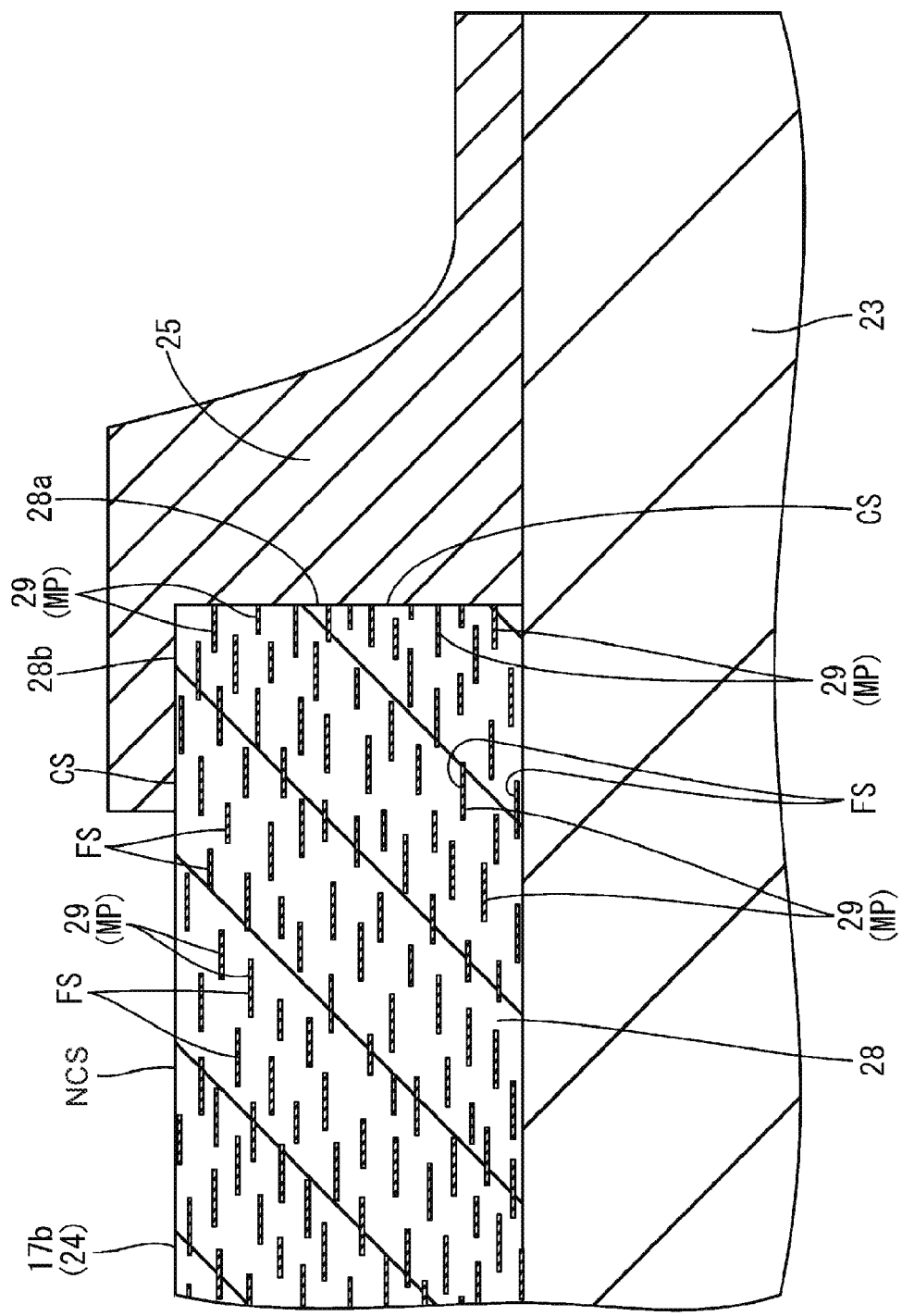
FIG. 6 is a cross-sectional view that is an enlarged view of FIG. 4 and shows respective contacting portions of an organic semiconductor film and the source electrode that form part of the TFT.

Thus, as shown in FIGS. 4 to 6, in the present embodiment, the source electrode 17b and the drain electrode 17c

(the second metal film 24) are respectively configured so as to be a mixture of a base metal material 28 that is formed of a metal material, and a low-resistance metal material 29 formed of a metal material having a contact resistance with respect to the organic semiconductor film 25 that is lower than that of the base metal material 28. In other words, the electrodes 17b, 17c are composite metal electrodes. Furthermore, the low-resistance metal material 29 is disposed so as to be exposed at contact surfaces CS of the source electrode 17b and the drain electrode 17c with the organic semiconductor film 25; thus, the exposed low-resistance metal material 29 makes ohmic contact with the organic semiconductor film 25 while maintaining a sufficiently low contact resistance. In addition, since the source electrode 17b and the drain electrode 17c are formed by mixing the base metal material 28 and the low-resistance metal material 29, which are both formed from metal materials, the electrical resistance of the source electrode 17b and the drain electrode 17c themselves is kept lower compared to instances in which a conductive polymer or the like is used. Furthermore, taking into account that the material costs of the low-resistance metal material 29 are generally higher than those of the base metal material 28, it is possible to lower manufacturing costs since the amount of low-resistance metal material 29 used in the present configuration is lower than in a configuration in which the source electrode and the drain electrode are formed of only the low-resistance metal material 29. In FIGS. 5 and 6, the source electrode 17b is used to represent the source electrode 17b and the drain electrode 17c; however, the drain electrode 17c has a configuration that is the reverse in the left-right direction of that shown in FIGS. 5 and 6 (a configuration in which the disposition of an opposing end face 28a is the reverse in the left-right direction).

Specifically, as shown in FIGS. 4 and 5, the base metal material 28 is formed in a film with a fixed film thickness, and the outer shape thereof substantially matches the outer shape of the source electrode 17b and the drain electrode 17c. The lower main surface of the base metal material 28 is the attachment surface with the surface of the gate insulating film 23, which is the base, while the opposing end faces 28a, at which the two electrodes 17b, 17c face other, of the periphery end faces along the thickness direction (Z axis direction) respectively form the main section (main contact section) of each contact surface CS with the organic semiconductor film 25. The entire opposing end face 28a of the base metal material 28 forms the main section of the contact surface CS. A section (a portion adjacent to the opposing end face 28a) of the upper main surface 28b of the base metal material 28 also forms a section (a secondary contact section) of the contact surface CS with the organic semiconductor film 25. In addition, sections (portions adjacent to the opposing end face 28a) of the two end faces 28c, 28d (the end face on the left side in FIG. 5 and the end face on the right side in FIG. 5) of the periphery end faces of the base metal material 28 that are respectively adjacent to the opposing end face 28a also form sections (secondary contact sections) of the contact surface CS with the organic semiconductor film 25. The metal material of the base metal material 28 according to the present embodiment may be copper (Cu), for example. Besides copper, it is possible to use aluminum (Al), tungsten (W), molybdenum (Mo), cobalt (Co), nickel (Ni), or the like, for example, as the metal material of the base metal material 28.

Meanwhile, as shown in FIGS. 5 and 6, the low-resistance metal material 29 is formed of a plurality of flat metal pieces MP contained in the base metal material 28. The plurality of metal pieces MP forming the low-resistance metal material 29 each have a substantially rectangular shape in a plan view, and the respective side dimensions and the thickness dimension thereof are set so as to each be sufficiently smaller than the respective side dimensions and the thickness dimension of the base metal material 28 in a plan view. Specifically, it is preferable that the respective side dimensions in a plan view of the plurality of metal pieces MP of the low-resistance metal material 29 be approximately 10 nm to 1 µm, for example. The plurality of metal pieces MP of the low-resistance metal material 29 are arranged in a regular manner such that a flat surface FS thereof is caused to be substantially parallel to the main surface 28b of the base metal material 28 and to be substantially orthogonal to (intersects) the opposing end face 28a that is the main section of the contact surface CS. The plurality of metal pieces MP of the low-resistance metal material 29 are arranged such that the flat surface FS thereof is also substantially orthogonal to the two end faces 28c, 28d (sections of the contact surface CS) that are adjacent to the opposing end face 28a. The number of metal pieces MP exposed at the respective end faces 28a, 28c, 28d of the contact surface CS of the base metal material 28 is greater than the number of metal pieces MP exposed at the main surface 28b. As a result of the above-mentioned configuration, since the metal pieces MP are more likely to be exposed at the respective end faces 28a, 28c, 28d, which are the contact surface CS, it is possible to reduce material costs and manufacturing costs by decreasing the content ratio of the low-resistance metal material 29.

Furthermore, as shown in FIGS. 5 and 6, a plurality of metal pieces MP of the low-resistance metal material 29 are disposed so as to be exposed at the contact surface CS (the entire opposing end face 28a, a section of the upper main surface 28b, and a section of the end faces 28c, 28d) of the base metal material 28 with the organic semiconductor film 25. As a result, the portion of the low-resistance metal material 29 exposed at the contact surface CS makes excellent ohmic contact with the organic semiconductor film 25. In addition, a plurality of metal pieces MP of the low-resistance metal material 29 are disposed so as to also be exposed at a non-contact surface NCS of the base metal material 28 that does not contact the organic semiconductor film 25. In other words, a plurality of metal pieces MP of the low-resistance metal material 29 are disposed so as to be exposed at each of the outer surfaces of the base metal material 28. In such a configuration, compared to a configuration in which the low-resistance metal material is disposed so as to be selectively exposed at only the contact surface CS with the organic semiconductor film 25, for example, it is not necessary to cause the arrangement of the low-resistance metal material 29 to be selective. As a result, since it is easy to form the source electrode 17b and the drain electrode 17c (the second metal film 24) during manufacturing, it is possible to further reduce manufacturing costs. The non-contact surface NCS includes, from among the outer surfaces of the base metal material 28, the lower main surface, the end face on the side opposite to the opposing end face 28a, and a large portion (a portion adjacent to the end face opposite to the opposing end face 28a) of the end faces 28c, 28d adjacent to the opposing end face 28a.

The metal material of the low-resistance metal material 29 according to the present embodiment may be silver (Ag), for example. Besides silver, it is possible to use gold, platinum, palladium, or the like, for example, as the metal material of the low-resistance metal material 29. In other words, it is preferable to use a noble metal in the metal material of the low-resistance metal material 29. In particular, in cases in which gold, platinum, or palladium are used as the metal material of the low-resistance metal material 29, compared to the metal material of the base metal material 28, the work function has a higher value and the difference between this higher work function value and the work function value of the organic semiconductor material of the organic semiconductor film 25 becomes smaller. Thus, it is possible to cause the low-resistance metal material 29 to make even better ohmic contact with the organic semiconductor film 25. In this manner, the material costs per unit mass of the low-resistance metal material 29 are higher than the corresponding material costs of the base metal material 28.

The content ratio of the low-resistance metal material 29 in the source electrode 17b and the drain electrode 17c is smaller than the content ratio of the base metal material 28. As a result, compared to an instance in which the source electrode and the drain electrode are formed of only the low-resistance metal material 29, it is possible to reduce the material costs associated with the source electrode 17b and the drain electrode 17c. Specifically, the content ratio of the low-resistance metal material 29 in the source electrode 17b and the drain electrode 17c is between 1% and 30%. If the content ratio of the low-resistance metal material is below 1%, there is a tendency for the contact resistance of the source electrode 17b and the drain electrode 17c with respect to the organic semiconductor film 25 to become too high. Conversely, if the content ratio of the low-resistance metal material exceeds 30%, there is a tendency for the manufacturing costs to become too high since a larger amount of low-resistance metal material is used. Therefore, by having the content ratio of the low-resistance metal material 29 be between 1% and 30%, it is possible to sufficiently lower the contact resistance of the source electrode 17b and the drain electrode 17c with respect to the organic semiconductor film 25, and it is also possible to reduce manufacturing costs since the amount of low-resistance metal material 29 that is used is kept low.

The present embodiment has the above-mentioned configuration, and a method of manufacturing the liquid crystal panel 11 that forms a part of the liquid crystal display device 10 will be explained next. The liquid crystal panel 11 is manufactured by completing: a CF substrate manufacturing step in which the CF substrate 11a is manufactured; an array substrate manufacturing step in which the array substrate 11b is manufactured; a liquid crystal dripping step in which liquid crystal material is dripped onto the array substrate 11b or the CF substrate 11a; and a bonding step in which the two substrates 11a, 11b are bonded. The array substrate manufacturing step will be explained in detail below. Since the CF substrate 11a and the array substrate 11b of the present embodiment are manufactured using synthetic resin, and there is concern that flatness cannot be ensured due to the substrates being thinner than those made of glass, flatness is ensured during the respective manufacturing steps by supporting the respective substrates 11a, 11b from the rear via a glass supporting substrate SB that has high rigidity. The supporting substrate SB is removed from the respective substrates 11a, 11b after the various manufacturing steps have been completed.

Figure 7:
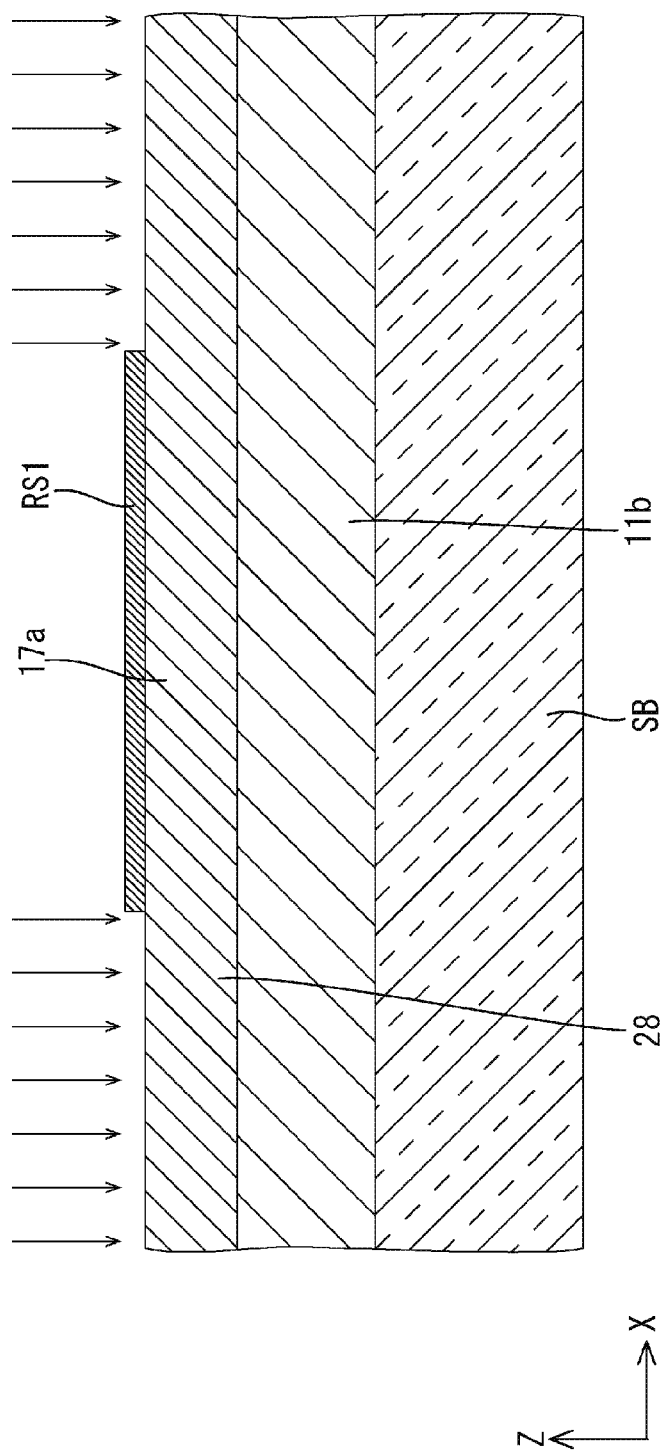
FIG. 7 shows a method of manufacturing the TFT, and is a cross-sectional view that shows a step of patterning a resist coated onto a gate metal film that will form the gate electrode, and then etching the gate metal film using the resist as a mask.

During the array substrate manufacturing step, a first metal film formation step in which the first metal film 22 is formed, a gate insulating film formation step in which the gate insulating film 23 is formed, a second metal film formation step in which the second metal film 24 is formed, an organic semiconductor film formation step in which the organic semiconductor film 25 is formed, a planarizing film formation step in which the planarizing film 26 is formed, and a transparent electrode film formation step in which the transparent electrode film 27 is formed, are carried out in this order. As shown in FIG. 7, during the first metal film formation step, a three-layer formed film that forms the first metal film 22 is sequentially formed in a uniformly-planar shape using a film formation method such as sputtering, CVD, vacuum deposition, or the like. After this, a resist RS1 having a planar shape similar to that of the gate electrode 17a and the gate wiring lines (not shown) is patterned, and the gate electrode 17a and the gate wiring lines are patterned via wet etching, for example, using the resist RS1 as a mask. At such time, the respective layers of the formed film are etched by using an etchant that utilizes hydrogen fluoride or an oxidizing agent to etch the titanium layers of the formed film, and using a mixed liquid etchant of phosphoric acid, nitric acid, and acetic acid to etch the aluminum layer. After etching has been performed, the resist RS1 is removed using a removal solution. It is also possible to use electroplating, electroless plating, printing that utilizes a conductive paste, or the like, as the method of forming the first metal film 22. In addition, in FIG. 7, etching of the portion of the first metal film 22 not masked by the resist RS1 is expressed via the arrows.

Figure 8:
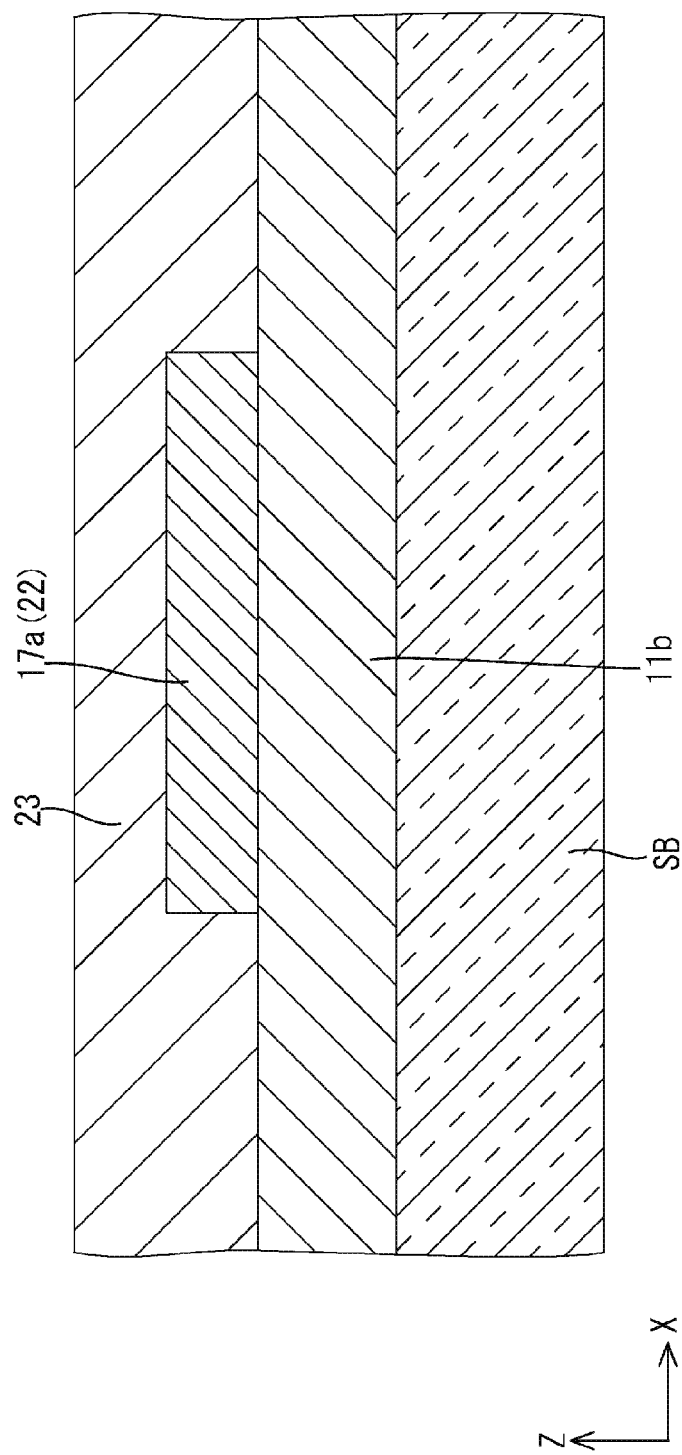
FIG. 8 shows the method of manufacturing the TFT, and is a cross-sectional view that shows a step of forming a gate insulating film on a resin substrate and the gate electrode.

As shown in FIG. 8, during the gate insulating film formation step, an organic resin material is coated in a uniformly-planar manner onto the surfaces of the array substrate 11b and the patterned first metal film 22 and then baked. The baking is performed for approximately several to several dozen minutes at a temperature of approximately 100° C. to 150° C. If it is necessary to form an opening such as a contact hole in the gate insulating film 23, the opening should be patterned using photolithography.

Figure 9:
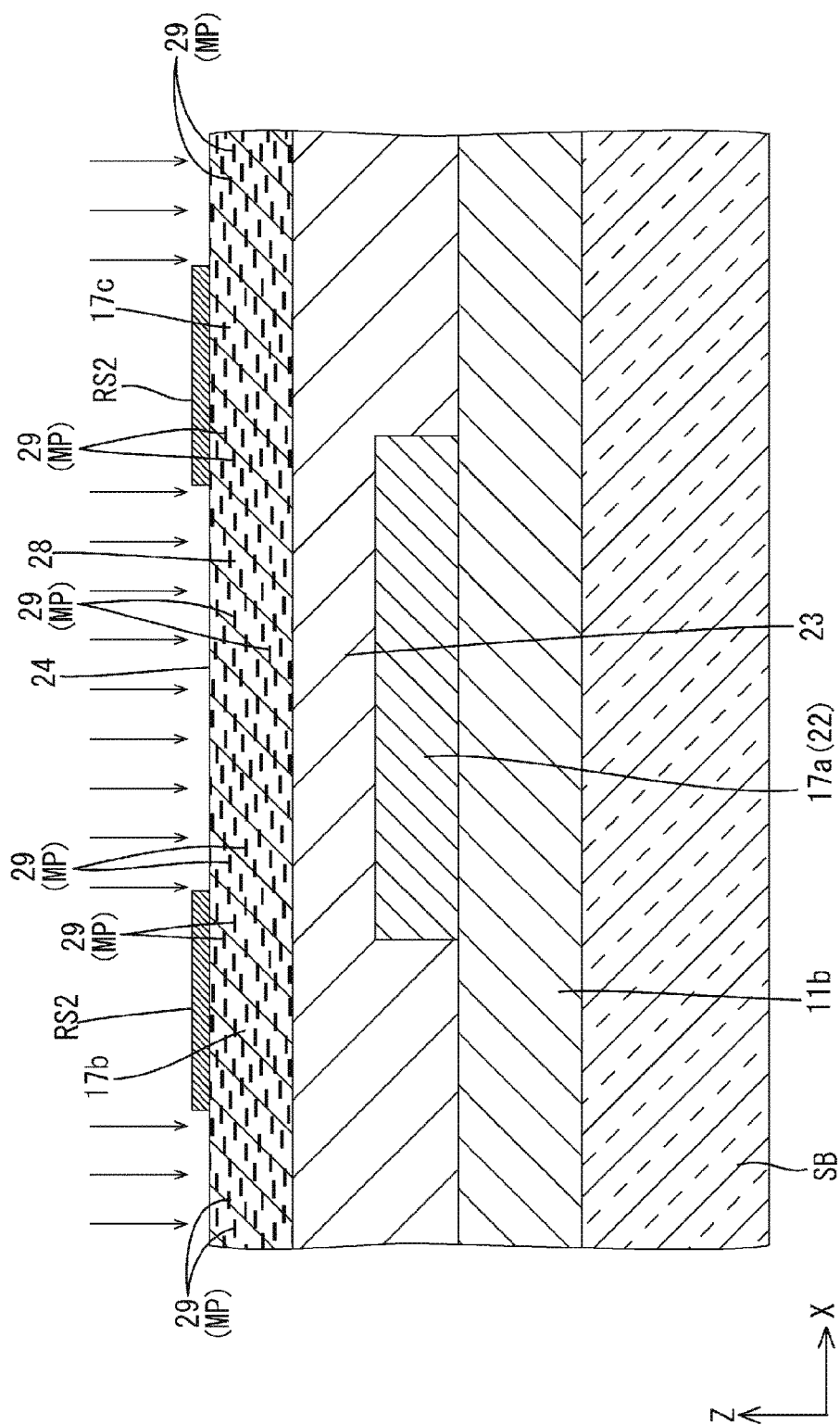
FIG. 9 shows the method of manufacturing the TFT, and is a cross-sectional view that shows a step of patterning a resist coated onto a base metal film that will form the source electrode and the drain electrode, and then etching the base metal film using the resist as a mask.

As shown in FIG. 9, during the second metal film formation step, the second metal film 24 is first formed in a uniformly-planar manner on the surface of the gate insulating film 23. It is preferable to use sputtering or vacuum deposition as the method of forming the second metal film 24. When sputtering is used, a target may be transferred onto the gate insulating film 23 by: preparing a target in which metal pieces MP, which are the low-resistance metal material 29 formed of silver, are dispersed in the base metal material 28 formed of copper at a content ratio of 1% to 30%, and then sputtering the target using argon gas or the like, for example. When vacuum deposition is used, the base metal material 28 formed of copper and the low-resistance metal material 29 formed of silver may be deposited at the same time, for example. Once the second metal film 24 has been formed, a resist RS2 having a planar shape similar to that of the source electrode 17b, the drain electrode 17c, and the source wiring lines (not shown) is patterned, after which the source electrode 17b, the drain electrode 17c, and the source wiring lines are patterned via wet etching, for example, using the resist RS2 as a mask. At such time, the base metal material 28 made of copper is etched using an etchant made of hydrogen peroxide and an organic acid. When etching is performed, the low-resistance metal material 29 contained in the portion of the base metal material 28 that is being etched is lifted off and removed. Therefore, the low-resistance metal material 29 disposed so as to extend from the portion of the base metal material 28 that will be etched to the portion of the base metal material 28 that will not be etched is disposed so as to be exposed at the outer surfaces of the source electrode 17b and the drain electrode 17c that were patterned via etching. These metal pieces MP of the low-resistance metal material 29 are disposed such that the flat surface FS thereof is substantially orthogonal to the end faces 28a, 28c, 28d of the base metal material 28; thus, a plurality of metal pieces MP are exposed at the end faces 28a, 28c, 28d. After etching has been performed, the resist RS2 is removed using a removal solution. In addition, in FIG. 9, etching of the portion of the second metal film 24 not masked by the resist RS2 is expressed via the arrows.

Figure 10:
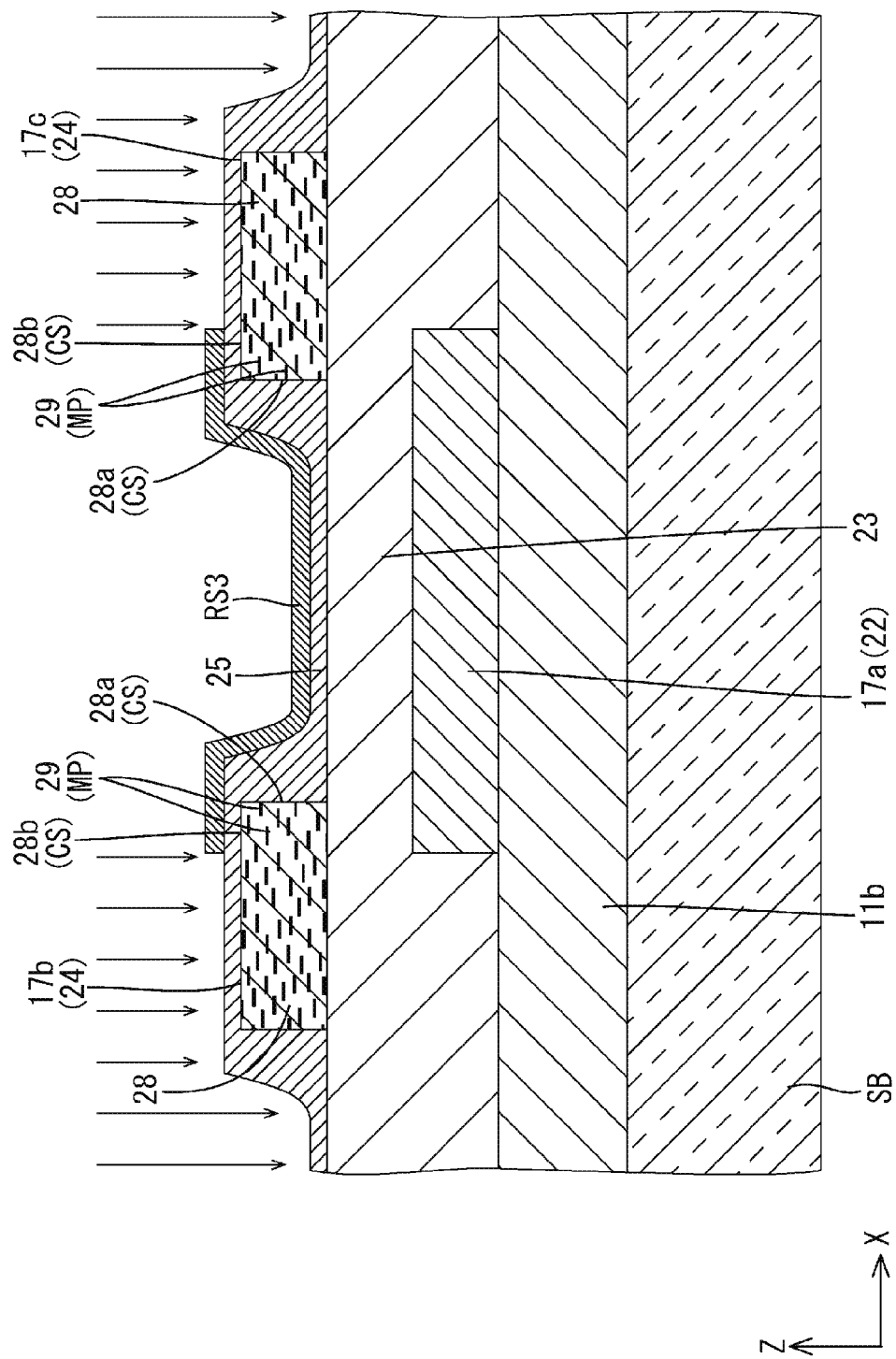
FIG. 10 shows the method of manufacturing the TFT, and is a cross-sectional view that shows a step of patterning a resist coated onto the organic semiconductor film that has been formed on the gate insulating film, the source electrode, and the drain electrode, and then etching the organic semiconductor film using the resist as a mask.

As shown in FIG. 10, during the organic semiconductor film formation step, the organic semiconductor film 25 is formed by coating an organic semiconductor material, which will form the organic semiconductor film 25, in a uniformly-planar manner onto the surfaces of the gate insulating film 23 and the second metal film 24 (the source electrode 17b and the drain electrode 17c) and then baking this organic semiconductor material. The baking is performed for approximately several to several dozen minutes at a temperature of approximately 100 C to 150° C. Once the organic semiconductor film 25 is formed, an island-shaped resist RS3 is patterned onto the organic semiconductor film 25, and the organic semiconductor film 25 is patterned via wet etching, for example, using the resist RS3 as a mask. In other words, the organic semiconductor film 25 is patterned via photolithography. As the method of forming and patterning the organic semiconductor film 25, it is possible to use printing (screen printing, ink jet printing, or the like), for example, in place of the above-mentioned method. In addition, in FIG. 10, etching of the portion of the organic semiconductor film 25 not masked by the resist RS3 is expressed via the arrows.

Figure 11:
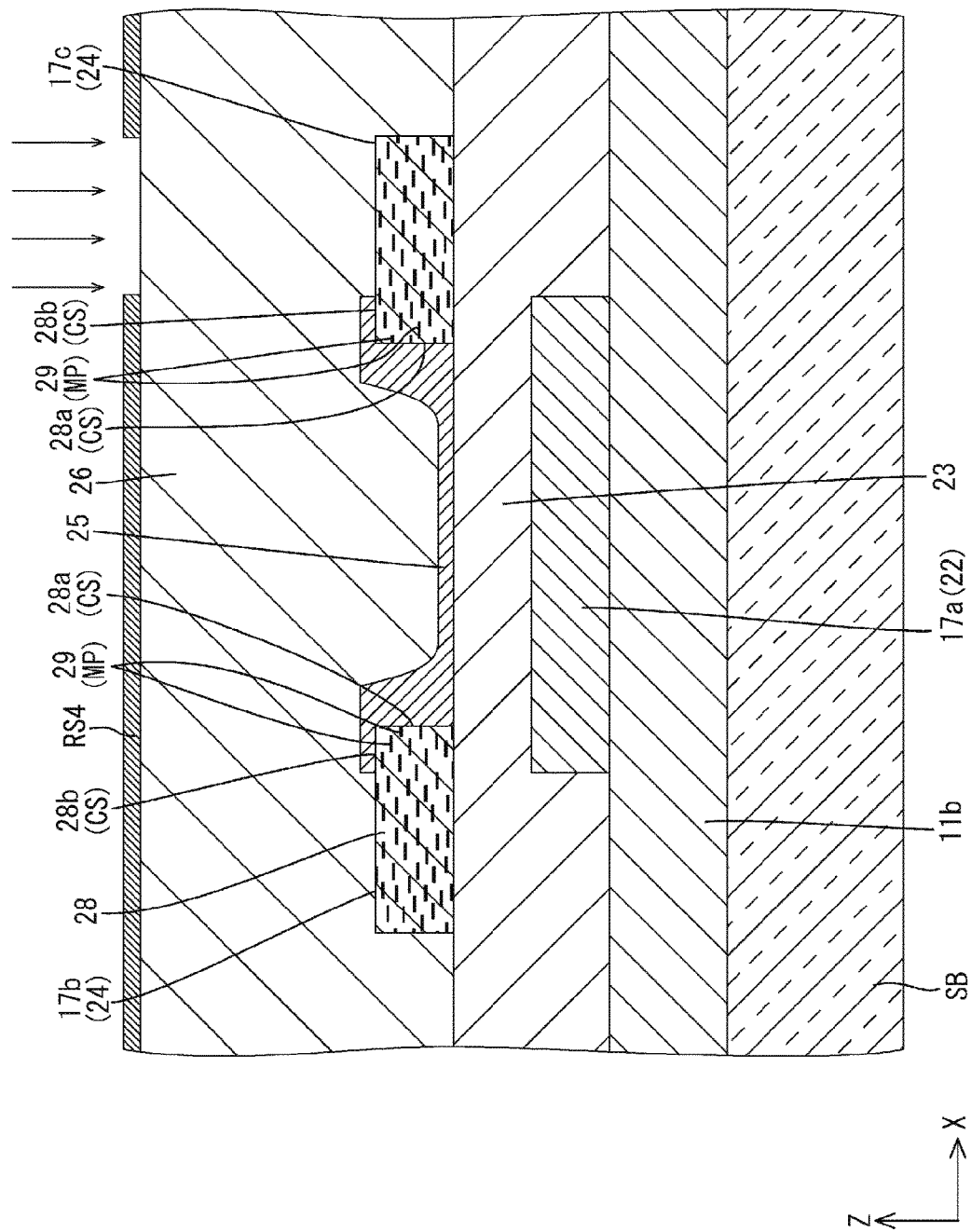
FIG. 11 shows the method of manufacturing the TFT, and is a cross-sectional view that shows a step of patterning a resist coated onto a planarizing film that has been formed on the gate insulating film, the source electrode, the drain electrode, and the organic semiconductor film, and then etching the planarizing film using the resist as a mask.

As shown in FIG. 11, during the planarizing film formation step, an organic resin material is coated in a uniformly-planar manner onto the surfaces of the gate insulating film 23, the second metal film 24 (the source electrode 17b and the drain electrode 17c), and the organic semiconductor film 25, and then baked. The baking is performed for approximately several to several dozen minutes at a temperature of approximately 100° C. to 150° C. Once the planarizing film 26 has been formed, a resist RS4 having a planar shape similar to that of planarizing film 26, except for a portion where the contact hole CH will be formed (above a section of the drain electrode 17c), is patterned, after which the contact hole CH is patterned via dry etching, for example, using the resist RS4 as a mask. In addition, in FIG. 11, etching of the portion of the planarizing film 26 not masked by the resist RS4 is expressed via the arrows.

Figure 12:
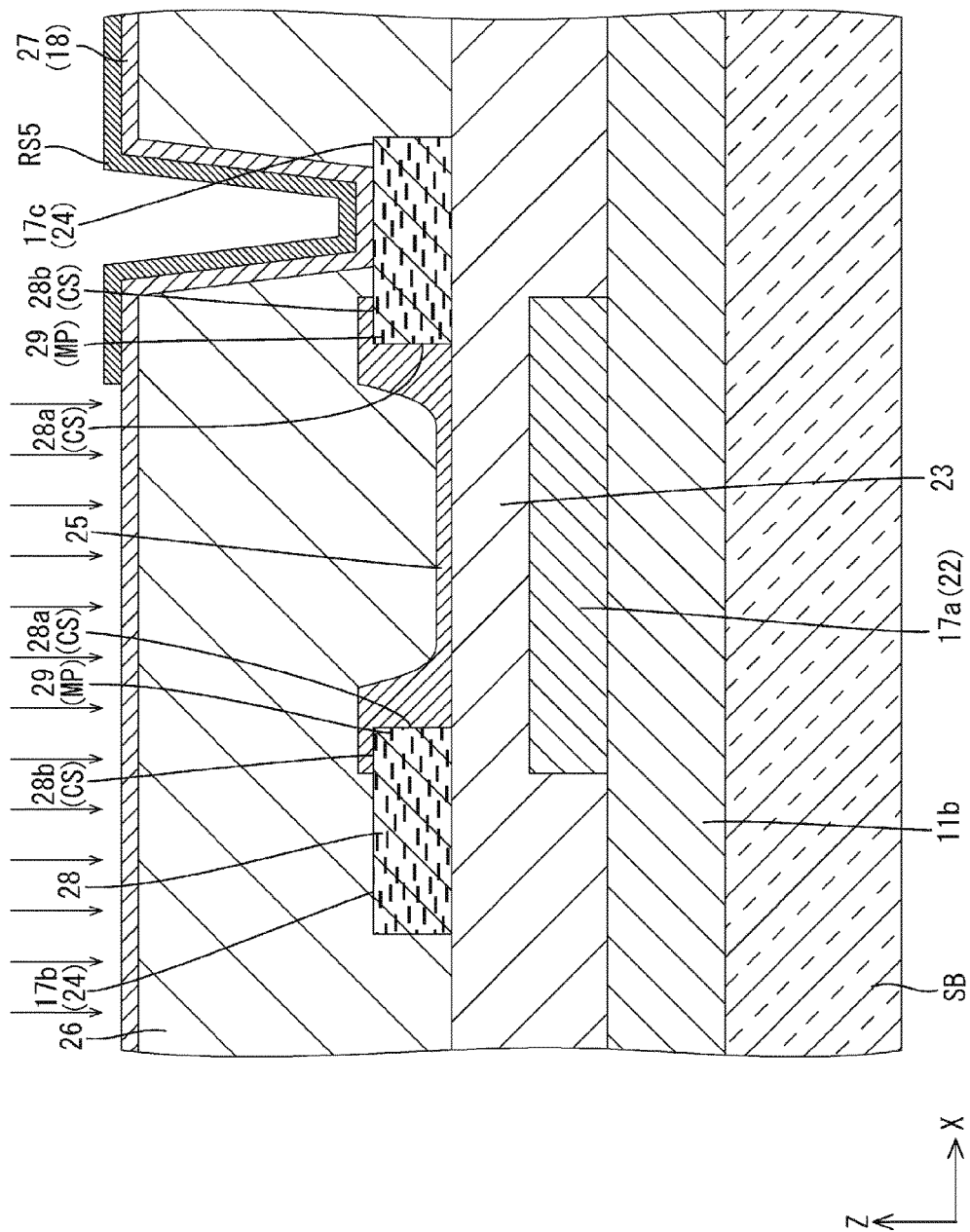
FIG. 12 shows the method of manufacturing the TFT, and is a cross-sectional view that shows a step of patterning a resist coated onto a transparent electrode film that has been formed on the drain electrode and the planarizing film, and then etching the transparent electrode film using the resist as a mask.

As shown in FIG. 12, during the transparent electrode film formation step, the transparent electrode film 27 is formed by coating a transparent electrode material onto the surfaces of the planarizing film 26 and the second metal film 24 (the drain electrode 17c) in a uniformly-planar manner. At such time, a portion of the transparent electrode film 27 that overlaps the drain electrode 17c in a plan view contacts the drain electrode 17c via the contact hole CH. Once the transparent electrode film 27 is formed, a resist RS5 with a planar shape similar to the pixel electrode 18 is patterned, and the pixel electrode 18 is patterned via wet etching, for example, using the resist RS5 as a mask. Using the above-mentioned method, a TFT 17 with the structure shown in FIG. 4 is formed on the array substrate 11b. In addition, in FIG. 12, etching of the portion of the transparent electrode film 27 not masked by the resist RS5 is expressed via the arrows.

As described above, a TFT (semiconductor device) 17 of the present embodiment includes an organic semiconductor film 25 formed from an organic semiconductor material, and a source electrode 17b and a drain electrode 17c (composite metal electrodes) that contact the organic semiconductor film 25. The source electrode 17b and the drain electrode 17c are configured such that a low-resistance metal material 29 that makes ohmic contact with the organic semiconductor film 25, the contact resistance thereof being lower than that of a base metal material 28 formed of a metal material, is mixed with the base metal material 28, and the low-resistance metal material 29 is disposed so as to be exposed at least at the contact surface CS with the organic semiconductor film 25.

In this manner, the source electrode 17b and the drain electrode 17c that contact the organic semiconductor film 25 are configured such that the low-resistance metal material 29 that makes ohmic contact with the organic semiconductor film 25, the contact resistance thereof being lower than that of the base metal material 28 formed of a metal material, is mixed with the base metal material 28, and the low-resistance metal material 29 is disposed so as to be exposed at least at the contact surface CS with the organic semiconductor film 25; thus, it is possible to cause the source electrode 17b and the drain electrode 17c to make excellent ohmic contact with the organic semiconductor film 25 while having a sufficiently low contact resistance, and to keep the electrical resistance of the source electrode 17b and the drain electrode 17c themselves low. In addition, taking into account that the material cost of the low-resistance metal material 29 is generally higher than that of the base metal material 28, it is possible to lower manufacturing costs since the amount of low-resistance metal material 29 used in the present configuration is lower than in a configuration in which the source electrode 17b and the drain electrode 17c are formed of only the low-resistance metal material 29. Thus, it is possible to lower the electrical resistance of the source electrode 17b and the drain electrode 17c and reduce manufacturing costs while lowering the contact resistance of the source electrode 17b and the drain electrode 17c with respect to the organic semiconductor film 25.

In addition, the base metal material 28 is formed in a film with at least an end face along the thickness direction thereof being a contact surface CS, while the low-resistance metal material 29 is formed of a plurality of flat metal pieces MP contained within the base metal material 28, and a flat surface FS of the metal pieces MP intersects the above-mentioned end face. By using such a configuration, the low-resistance metal material 29 is formed of a plurality of flat metal pieces MP contained within the base metal material 28, and a flat surface FS thereof intersects an end face along the thickness direction of the film-shaped base metal material 28; thus, it becomes easier for the metal pieces MP to be exposed at the end face of the base metal material 28. As a result, since the metal pieces MP efficiently contact the organic semiconductor film 25, it is possible to sufficiently lower the contact resistance of the source electrode 17b and the drain electrode 17c with respect to the organic semiconductor film 25, even if manufacturing costs are lowered by reducing the metal piece MP content, for example.

In addition, the source electrode 17b and the drain electrode 17c are configured such that the low-resistance metal material 29 is disposed so as to be exposed at both the contact surface CS and a non-contact surface NCS that does not contact the organic semiconductor film 25. In such a configuration, compared to a configuration in which the low-resistance metal material is selectively exposed at only the contact surface CS with the organic semiconductor film 25, it is not necessary to cause the arrangement of the low-resistance metal material 29 to be selective. As a result, since it is easy to form the source electrode 17b and the drain electrode 17c during manufacturing, it is possible to further reduce manufacturing costs.

Furthermore, the source electrode 17b and drain electrode 17c are configured such that the content ratio of the low-resistance metal material 29 therein is between 1% and 30%. In general, the low-resistance metal material 29 has higher material costs than the base metal material 28. If the content ratio of the low-resistance metal material is below 1%, there is a tendency for the contact resistance of the source electrode 17b and the drain electrode 17c with respect to the organic semiconductor film 25 to become too high. Conversely, if the content ratio of the low-resistance metal material exceeds 30%, there is a tendency for manufacturing costs to become too high since a larger amount of low-resistance metal material 29 is used. Therefore, by having the content ratio of the low-resistance metal material 29 be between 1% and 30%, it is possible to sufficiently lower the contact resistance of the source electrode 17b and the drain electrode 17c with respect to the organic semiconductor film 25, and it is also possible to reduce manufacturing costs since the amount of low-resistance metal material 29 that is used is kept low.

In addition, the display device includes: an array substrate (a substrate) 11b; a gate electrode 17a formed on the array substrate 11b; and a gate insulating film (an insulating film) 23 formed on the gate electrode 17a on a side opposite to the array substrate 11b. The organic semiconductor film 25 is formed on the gate insulating film 23 on the side opposite to the array substrate 11b, and is disposed so as to overlap the gate electrode 17a. Meanwhile, the composite metal electrodes are constituted of the source electrode 17b and the drain electrode 17c that are formed on the gate insulating film 23 on the side opposite to the array substrate 11b with a gap therebetween and that respectively contact the organic semiconductor film 25. In such a configuration, when voltage is applied to the gate electrode 17a formed on the array substrate 11b, an electric field is applied to the organic semiconductor film 25 that overlaps the gate electrode 17a through the gate insulating film 23; thus, electric charges are transferred between the source electrode 17b and the drain electrode 17c, which constitute the composite metal electrodes, via the organic semiconductor film 25. Since the respective electrodes 17a to 17c and the gate insulating film 23 are not disposed on the side of the organic semiconductor film 25 that is opposite to the array substrate 11b, it is possible to prevent the organic semiconductor film 25 from being affected by heat generated when the respective electrodes 17a to 17c are formed during the manufacturing process.

Furthermore, the low-resistance metal material 29 may be formed from any one of silver, gold, platinum, and palladium. In such a configuration, the low-resistance metal material 29 makes excellent ohmic contact with the organic semiconductor film 25; thus, it is possible to more suitably lower the contact resistance of the source electrode 17b and the drain electrode 17c with respect to the organic semiconductor film 25.

In addition, the metal material forming the base metal material 28 may be made of any one of copper, aluminum, tungsten, molybdenum, cobalt, and nickel. In such a configuration, it is possible to keep the material costs associated with the source electrode 17b and the drain electrode 17c low while also keeping the electrical resistance of the source electrode 17b and the drain electrode 17c sufficiently low.

Furthermore, the liquid crystal panel (a display device) 11 according to the present embodiment includes the array substrate (a device substrate) 11b that includes the above-mentioned TFT 17 as a switching element. In a display device with such a configuration, it is possible to obtain excellent display performance since the switching element has excellent electrical properties, and manufacturing costs will also be kept low.

In addition, the display device includes: a CF substrate (opposite substrate) 11a that faces the array substrate 11b, and a liquid crystal layer 11c sandwiched between the array substrate 11b and the CF substrate 11a. With such a configuration, the liquid crystal panel 11 can be used as a liquid crystal display device 10 in a variety of applications such as smartphone and tablet PC displays, for example.

Embodiment 2

Embodiment 2 of the present invention will be described using FIG. 13. In Embodiment 2, an example is used in which a protective film 30 is provided to protect an organic semiconductor film 125. Descriptions of structures, operations, and effects similar to those of Embodiment 1 will be omitted.

Figure 13:
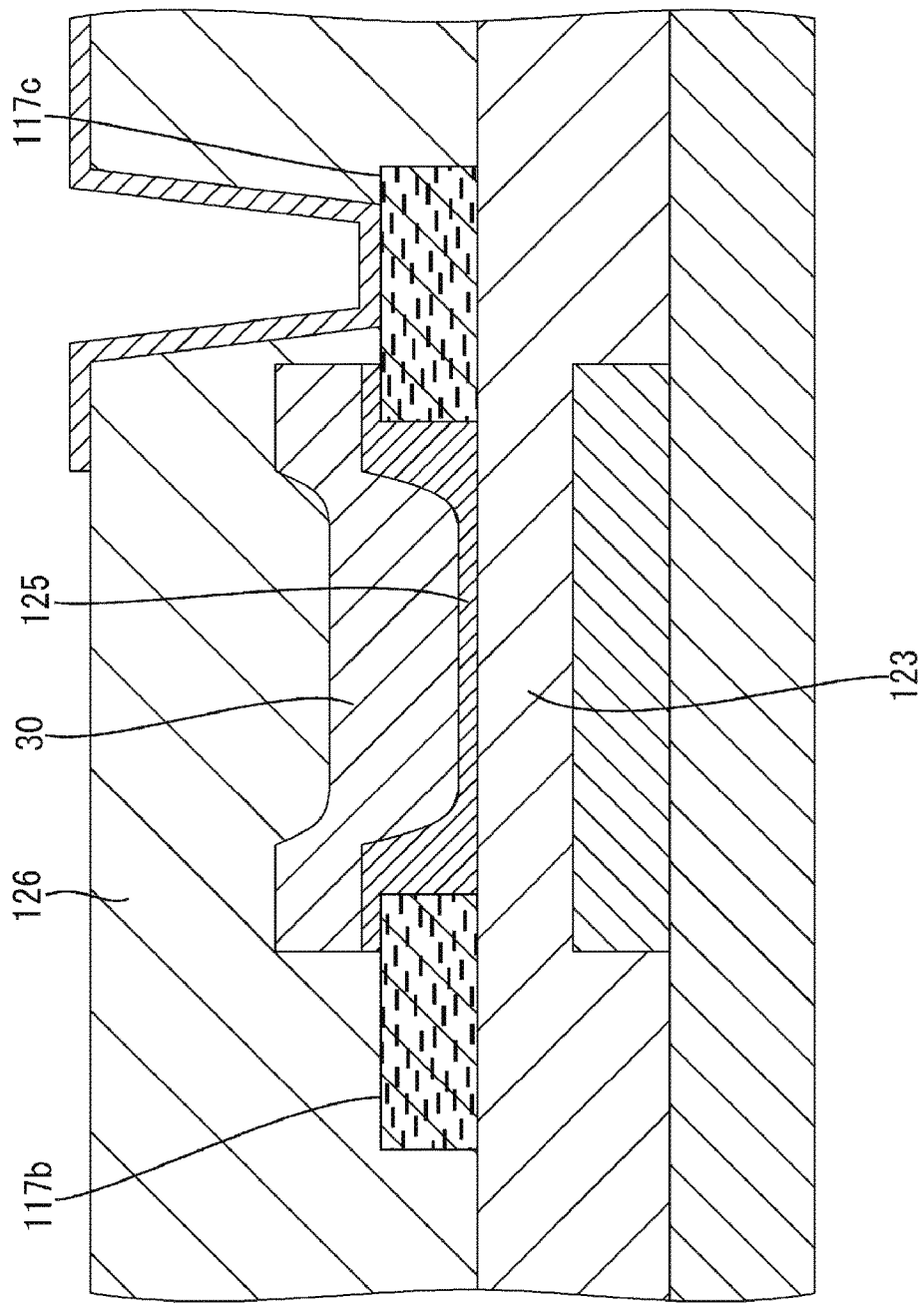
FIG. 13 is a cross-sectional view that shows a cross-sectional configuration of a TFT according to Embodiment 2 of the present invention.

As shown in FIG. 13, the protective film 30 according to the present embodiment is formed on top of the organic semiconductor film 125 (formed on the side opposite to a gate insulating film 123 that is the underlying surface of a source electrode 117b and a drain electrode 117c). The protective film 30 is formed of an organic resin material, and is disposed such that the pattern thereof in a plan view matches the organic semiconductor film 125 and the protective film overlaps the semiconductor film 125. In other words, since the entire top of the organic semiconductor film 125 is covered by the protective film 30, damage to the organic semiconductor film 125 caused by solvents contained in organic resin material in a planarizing film 126 is prevented from occurring when the planarizing film 126 is formed on top of the organic semiconductor film 125 and the protective film 30, for example. Additionally, even if the planarizing film 126 disposed on top of the organic semiconductor film 125 and the protective film 30 contains moisture, for example, this moisture is prevented from damaging the organic semiconductor film 125. The thickness of the protective film 30 is larger than the thickness of the organic semiconductor film 125.

According to the present embodiment as described above, the organic semiconductor film 125 has a portion formed on an underlying surface on which the source electrode 117b and the drain electrode 117c are formed and portions respectively formed on the side of the source electrode 117b and drain electrode 117c opposite to the underlying surface. In addition, the display device further includes the protective film 30 formed on the side of the organic semiconductor film 125 opposite to the underlying surface. In such a configuration, the organic semiconductor film 125 has portions respectively formed on the side of the source electrode 117b and drain electrode 117c opposite to the underlying surface; thus, it is possible to prevent the organic semiconductor film 125 from being affected by heat generated when the source electrode 117b and drain electrode 117c are formed during the manufacturing process. Furthermore, since the protective film 30 is formed on the side of the organic semiconductor film 125 opposite to the underlying surface, even in cases in which a different film is formed on the side of the protective film 30 opposite to the organic semiconductor film 125 and this film possesses the capability of damaging the organic semiconductor film 125, for example, it is unlikely that the organic semiconductor film 125 will be damaged since the organic semiconductor film 125 is protected by the protective film 30.

Embodiment 3

Embodiment 3 of the present invention will be described using FIG. 14. In Embodiment 3, the arrangement of the low-resistance metal material 229 has been modified from that of Embodiment 1. Descriptions of structures, operations, and effects similar to those of Embodiment 1 will be omitted.

Figure 14:
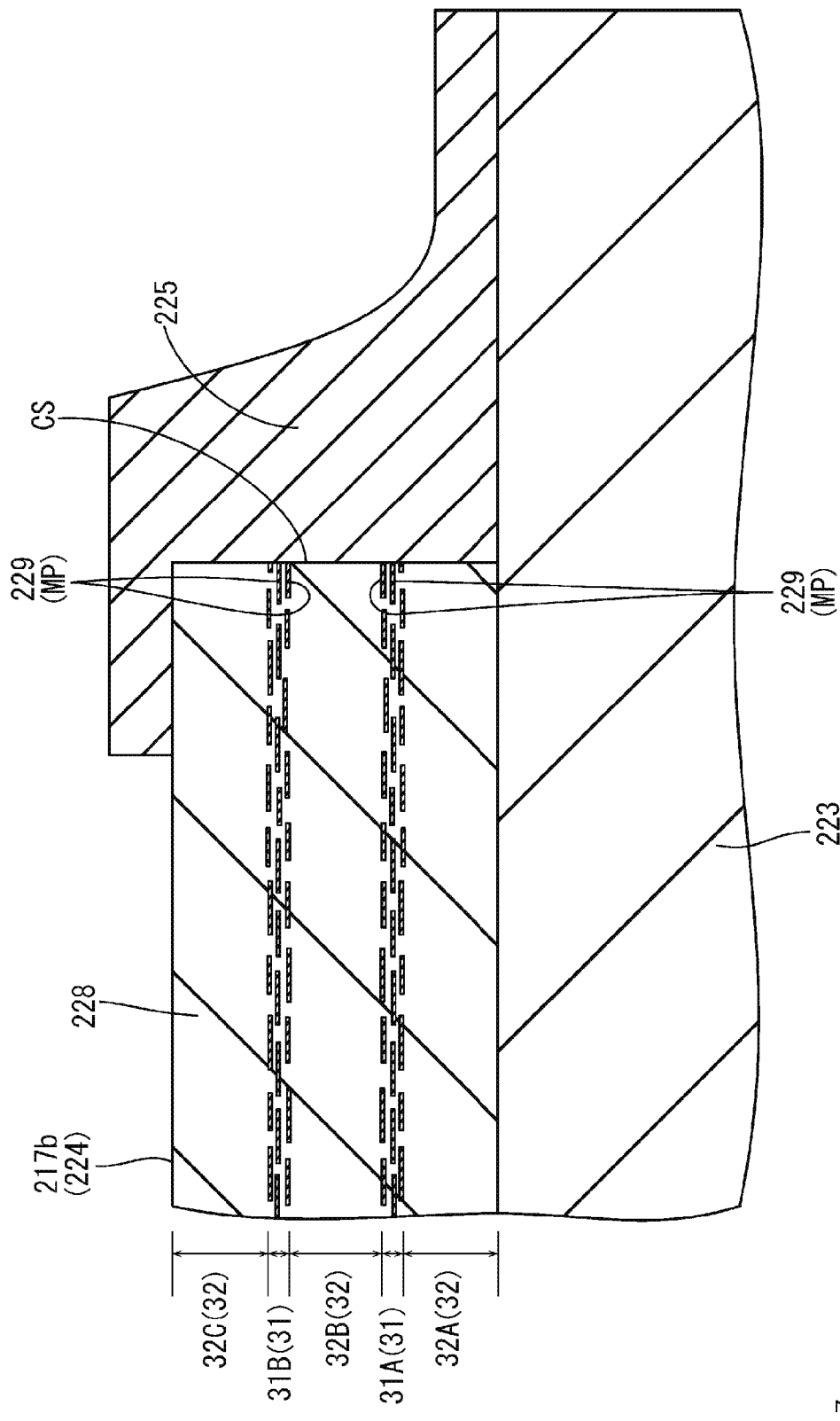
FIG. 14 is a cross-sectional view that shows respective contacting portions of an organic semiconductor film and a source electrode that form part of a TFT according to Embodiment 3 of the present invention.

As shown in FIG. 14, the metal pieces MP of a low-resistance metal material 229 according to the present embodiment are disposed in layers in a source electrode 217b (a second metal film 224). In other words, the source electrode 217b is formed by forming low-resistance metal-based layers 31 in which a relatively large amount of the low-resistance metal material 229 is disposed, and base metal-based layers 32 in which a relatively large amount of base metal material 228 is disposed. A plurality of metal pieces MP forming the low-resistance metal material 229 are concentrated at a high distribution density in the low-resistance metal-based layer 31, and the base metal material 228 is interposed between adjacent metal pieces MP in this layer. Most of the base metal-based layer 32 is formed of the base metal material 228, and for the most part does not include the metal pieces MP of the low-resistance metal material 229. By using such a configuration, in the low-resistance metal-based layers 31 in the source electrode 217b, a larger number of metal pieces MP are exposed at the contact surface CS with an organic semiconductor film 225, and there is an increase in the likelihood that a particular metal piece MP will be exposed. Therefore, it is possible to cause the low-resistance metal material 229 to make better ohmic contact with the organic semiconductor film 225.

The low-resistance metal-based layers 31 and the base metal-based layers 32 are alternately disposed in parallel in the source electrode 217b along the thickness direction thereof (the Z axis direction), and are specifically formed of: a first base metal-based layer 32A, a first low-resistance metal-based layer 31A, a second base metal-based layer 32B, a second low-resistance metal-based layer 31B, and a third base metal-based layer 32C, formed in this order from the bottom (the side facing a gate insulating film 223 that is the base). The thickness dimension of the low-resistance metal-based layers 31 is smaller than the thickness dimension of the base metal-based layers 32. Specifically, the thickness dimension of the low-resistance metal-based layers 31 is approximately 10 nm, for example, while the thickness dimension of the base metal-based layers 32 is approximately 60 nm, for example. Only the source electrode 217b is shown in FIG. 14; the drain electrode (not shown) has a configuration similar to that of the source electrode 217b, however.

According to the present embodiment as described above, the source electrode 217b (drain electrode) is formed by forming low-resistance metal-based layers 31 in which a relatively large amount of the low-resistance metal material 229 is disposed, and base metal-based layers 32 in which a relatively large amount of base metal material 228 is disposed. In such a configuration, compared to a case in which the low-resistance metal material is evenly dispersed within the base metal material, the low-resistance metal material 229 is more reliably exposed, in the low-resistance metal-based layers 31 of the source electrode 217b (drain electrode), at the contact surface CS with the organic semiconductor film 225 of the source electrode 217b (drain electrode). As a result, since the low-resistance metal material 229 efficiently contacts the organic semiconductor film 225, it is possible to sufficiently lower the contact resistance of the source electrode 217b (drain electrode) with respect to the organic semiconductor film 225 even if manufacturing costs are lowered by reducing the low-resistance metal material 229 content, for example.

Embodiment 4

Embodiment 4 of the present invention will be described using FIG. 15. In Embodiment 4, the arrangement of the low-resistance metal material 329 has been modified from that of Embodiment 3. Descriptions of structures, operations, and effects similar to those of Embodiment 3 will be omitted.

Figure 15:
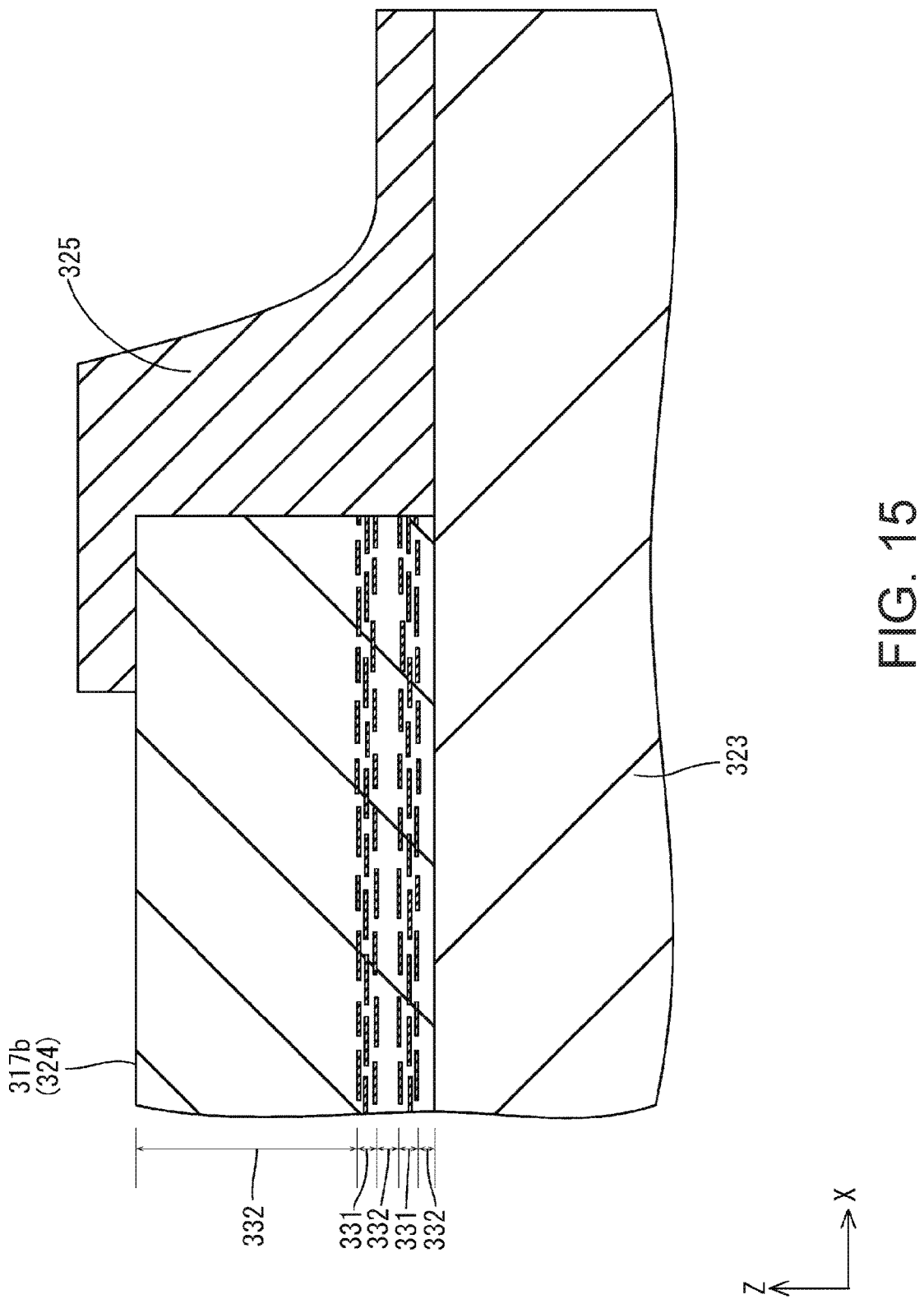
FIG. 15 is a cross-sectional view that shows respective contacting portions of an organic semiconductor film and a source electrode that form part of a TFT according to Embodiment 4 of the present invention.

As shown in FIG. 15, a source electrode 317b (second metal film 324) according to the present embodiment is configured such that low-resistance metal-based layers 331 are disposed closer to the bottom (the side facing a gate insulating film 323 that is the base) in the thickness direction (Z axis direction) of the organic semiconductor film 325. As described in Embodiment 1, the main section (the portion sandwiched between the source electrode 317b and the drain electrode) of the organic semiconductor film 325 is formed on the surface of the gate insulating film 323 in a manner similar to the source electrode 317b and the drain electrode, and the thickness thereof is thinner than the source electrode 317b and the drain electrode. Thus, the pathway along which charges are transferred in the organic semiconductor film 325 is located at the bottom of the source electrode 317b and the drain electrode in the thickness direction thereof. Therefore, electric charges are mainly exchanged between the organic semiconductor film 325 and the bottom portion of the source electrode 317b and the drain electrode. As a countermeasure, in the present embodiment, the low-resistance metal-based layers 331 are disposed at the bottom of the organic semiconductor film 325 in the thickness direction thereof; thus, electric charges will be more smoothly exchanged between the organic semiconductor film 325 and the source electrode 317b (the drain electrode). As a result, it is possible to sufficiently lower the contact resistance of the source electrode 317b (the drain electrode) with respect to the organic semiconductor film 325. Only the source electrode 317b is shown in FIG. 15; the drain electrode (not shown) has a configuration similar to that of the source electrode 317b, however.

According to the present embodiment as described above, at least a section of the organic semiconductor film 325 is formed on an underlying surface on which the source electrode 317b (drain electrode) is formed, the thickness thereof being thinner than the thickness of the source electrode 317b (drain electrode), and the source electrode 317b (drain electrode) is configured such that the low-resistance metal-based layers 331 are disposed closer to the underlying surface in the thickness direction of the organic semiconductor film 325. In such a configuration, electric charges are mainly exchanged between the organic semiconductor film 325 and the portion of the source electrode 317b (drain electrode) that is closest to the underlying surface. Therefore, since the low-resistance metal-based layers 331 are disposed, in the source electrode 317b (drain electrode), closer to the underlying surface in the thickness direction of the organic semiconductor film 325, electric charges will be more smoothly exchanged between the organic semiconductor film 325 and the source electrode 317b (drain electrode). As a result, it is possible to sufficiently lower the contact resistance of the source electrode 317b (the drain electrode) with respect to the organic semiconductor film 325.

Embodiment 5

Embodiment 5 of the present invention will be described using FIG. 16. In Embodiment 5, the configuration of the TFT 417 has been modified from that of Embodiment 1. Descriptions of structures, operations, and effects similar to those of Embodiment 1 will be omitted.

Figure 16:
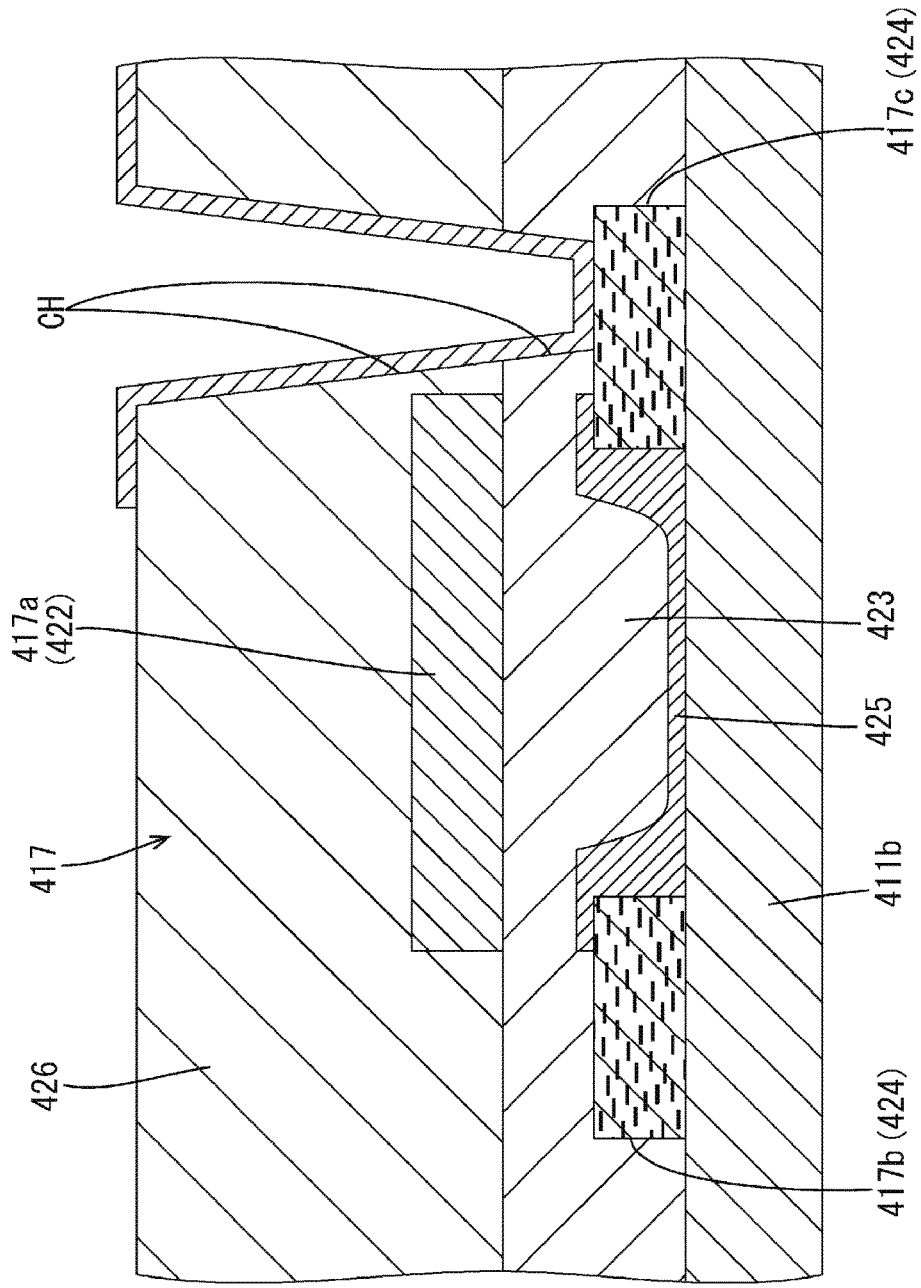
FIG. 16 is a cross-sectional view that shows a cross-sectional configuration of a TFT according to Embodiment 5 of the present invention.

As shown in FIG. 16, a TFT 417 includes: a source electrode 417b and a drain electrode 417c formed from a second metal film 424 formed on an array substrate 411b; an organic semiconductor film 425 formed on the array substrate 411b, the source electrode 417b, and the drain electrode 417c; a gate insulating film 423 formed on the array substrate 411b, the source electrode 417b, the drain electrode 417c, and the organic semiconductor film 425; and a gate electrode 417a formed from a first metal film 422 formed on the gate insulating film 423. Thus, this TFT is of a so-called "top gate" (staggered) type. The organic semiconductor film 425 is disposed on the bottom side (the side close to the array substrate 411b) of the gate electrode 417a, and is disposed so as to overlap the gate electrode 417a in a plan view through the gate insulating film 423. In this TFT 417, the source electrode 417b and the drain electrode 417c are disposed in the bottommost layer (the layer closest to the array substrate 411b); thus, the contact hole CH is formed so as to pass through both a planarizing film 426 and the gate insulating film 423.

Depending on the type of organic semiconductor material in the organic semiconductor film 425, there may instances in which a layer with excellent electrical conductivity may form in the upper portion (the side opposite to the array substrate 411b) of the organic semiconductor film 425 in the thickness direction thereof. In such a case, the layer with excellent electrical conductivity is disposed in the organic semiconductor film 425 closer to the gate electrode 417a compared to other portions of the film; thus, the TFT 417 will have excellent electrical properties.

According to the present embodiment as described above, the display device includes: an array substrate 411b on which are formed an organic semiconductor film 425 and a source electrode 417b and a drain electrode 417c that are composite metal electrodes; a gate insulating film (an insulating film) 423 formed on the organic semiconductor film 425 and the source electrode 417b and the drain electrode 417c, which are composite electrodes, on the side opposite to the array substrate 411b; and a gate electrode 417a formed on the gate insulating film 423 on a side opposite to the array substrate 411b. The organic semiconductor film 425 is disposed so as to overlap the gate electrode 417a, and the composite metal electrodes are formed of the source electrode 417b and the drain electrode 417c that are disposed with a gap therebetween and which respectively contact the organic semiconductor film 425. In such a configuration, when voltage is applied to the gate electrode 417a formed on the side of the gate insulating film 423 opposite to the array substrate 411b, an electric field is applied to the organic semiconductor film 425 that overlaps the gate electrode 417a through the gate insulating film 423. As a result, electric charges are transferred between the source electrode 417b and the drain electrode 417c, which form the composite metal electrodes, via the organic semiconductor film 425. Depending on the type of organic semiconductor material used in the organic semiconductor film 425, there may be instances in which a layer with excellent electrical conductivity forms in the portion of the organic semiconductor film 425 that is opposite to the array substrate 411b in the thickness direction thereof. In such a case, the layer with excellent electrical conductivity is disposed in the organic semiconductor film 425 closer to the gate electrode 417a compared to other portions of the film; thus, the TFT 417 will have excellent electrical properties.

Embodiment 6

Embodiment 6 of the present invention will be described using FIG. 17. In Embodiment 6, an adhesive film 33 is provided in Embodiment 1 that bonds the source electrode 517b and the drain electrode 517c to the gate insulating film 523 that is the base. Descriptions of structures, operations, and effects similar to those of Embodiment 1 will be omitted.

Figure 17:
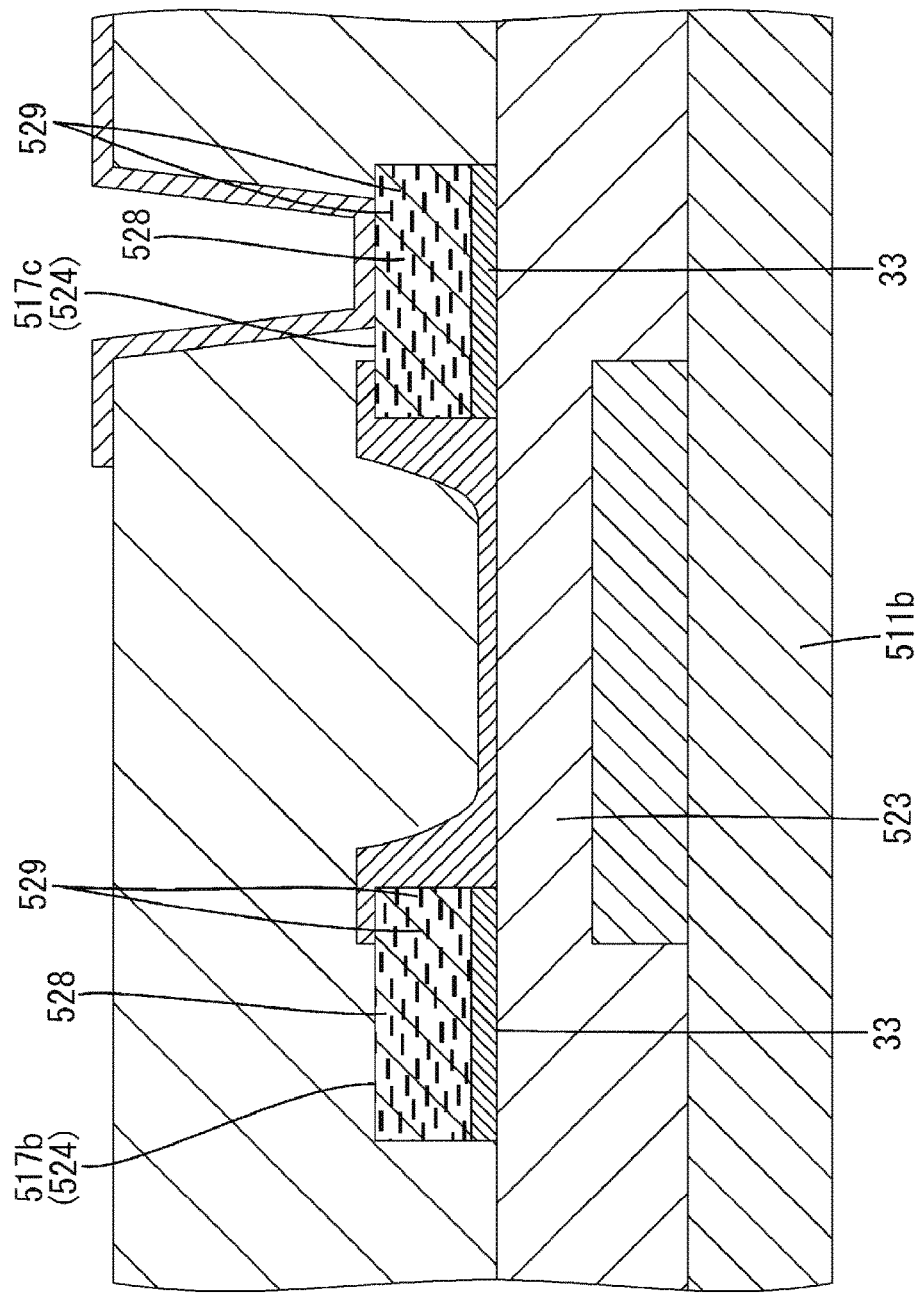
FIG. 17 is a cross-sectional view that shows a cross-sectional configuration of a TFT according to Embodiment 6 of the present invention.

As shown in FIG. 17, the adhesive film 33 is disposed so as to be interposed between a gate insulating film 523 and a drain electrode 517c/source electrode 517b (second metal film 524) according to the present embodiment. The adhesive film 33 is formed of a metal material that has good adhesion with respect to both the source electrode 517b/drain electrode 517c and the gate insulating film 523 that is the base. Specifically, the adhesive film 33 is formed from titanium (Ti), titanium nitride (TiN), tantalum nitride (TaN), or the like. The thickness of the adhesive film 33 is approximately 5 nm, for example. During the manufacturing process of an array substrate 511b, the adhesive film 33 is formed on the gate insulating film 523 before the second metal film 524 during the second metal film formation step, and is then patterned by being etched at the same time that the second metal film 524 is etched.

According to the present embodiment as described above, the display device includes an adhesive film that is disposed so as to be interposed between the source electrode 517b/drain electrode 517c and the underlying surface upon which the source electrode 517b and the drain electrode 517c are formed, and that bonds the source electrode 517b and the drain electrode 517c to the underlying surface. In such a configuration, even in cases in which a base metal material 528 and a low-resistance metal material 529 that form the source electrode 517b and the drain electrode 517c are materials that have poor adhesion with respect to the underlying surface, the adhesive film ensures that the source electrode 517b and the drain electrode 517c will bond to the underlying surface.

Embodiment 7

Embodiment 7 of the present invention will be described using FIG. 18. In Embodiment 7, the arrangement of the metal pieces MP of the low-resistance metal material 629 has been modified from that of Embodiment 1. Descriptions of structures, operations, and effects similar to those of Embodiment 1 will be omitted.

Figure 18:
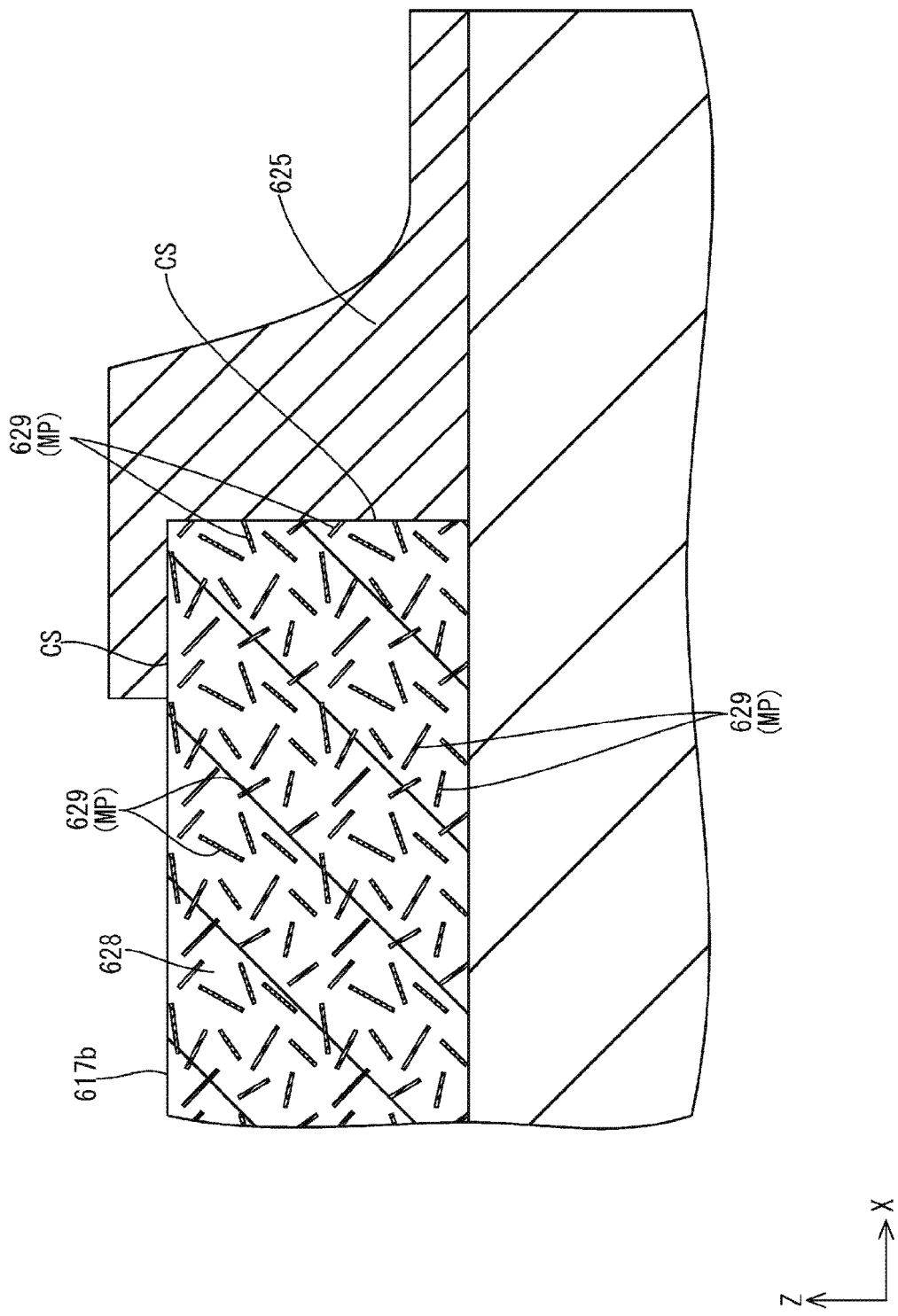
FIG. 18 is a cross-sectional view that shows respective contacting portions of an organic semiconductor film and a source electrode that form part of a TFT according to Embodiment 7 of the present invention.

As shown in FIG. 18, a plurality of metal pieces MP forming the low-resistance metal material 629 according to the present embodiment are randomly (irregularly) dispersed in a base metal material 628. Specifically, the flat surfaces FS of the plurality of metal pieces MP forming the low-resistance metal material 629 are not parallel to one another and the metal pieces MP are not arranged in a regular manner. Even in such a configuration, it is possible to cause the metal pieces MP of the low-resistance metal material 629 to be suitably exposed at the contact surface CS, with an organic semiconductor film 625, of a source electrode 617b (drain electrode). Only the source electrode 617b is shown in FIG. 18; the drain electrode (not shown) has a configuration similar to that of the source electrode 617b, however.

Embodiment 8

Embodiment 8 of the present invention will be described using FIG. 19. In Embodiment 8, the shape of the low-resistance metal material 729 has been modified from that of Embodiment 1. Descriptions of structures, operations, and effects similar to those of Embodiment 1 will be omitted.

Figure 19:
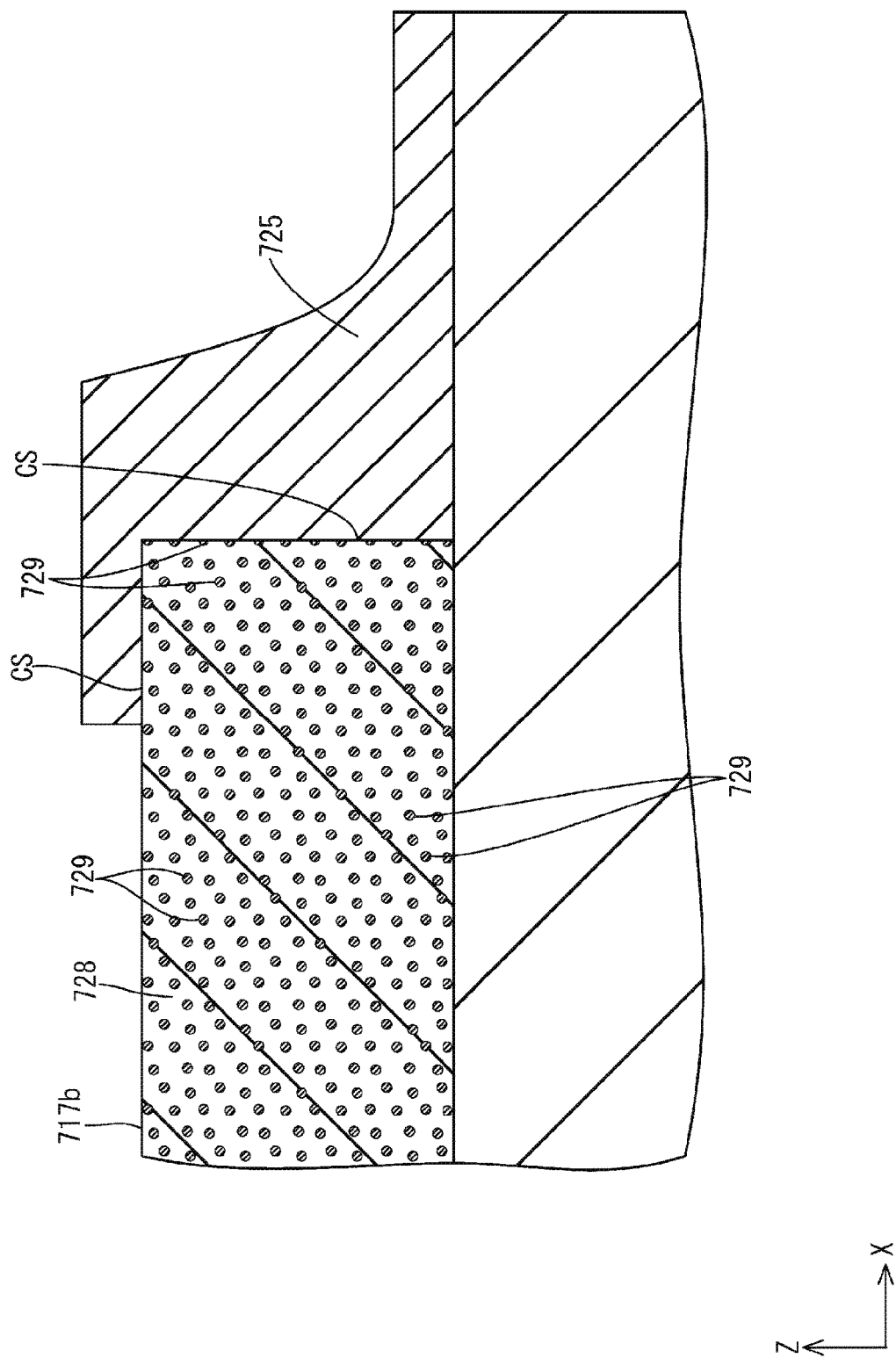
FIG. 19 is a cross-sectional view that shows respective contacting portions of an organic semiconductor film and a source electrode that form part of a TFT according to Embodiment 8 of the present invention.

As shown in FIG. 19, low-resistance metal material 729 according to the present embodiment has a spherical shape. A large amount of spherical low-resistance metal material 729 is randomly (irregularly) dispersed within the base metal material 728. Even in such a configuration, it is possible to cause the low-resistance metal material 729 to be suitably exposed at the contact surface CS, with an organic semiconductor film 725, of a source electrode 717b (drain electrode). Only the source electrode 717b is shown in FIG. 19; the drain electrode (not shown) has a configuration similar to that of the source electrode 717b, however.

Embodiment 9

Embodiment 9 of the present invention will be described using FIG. 20. In Embodiment 9, the shape of the low-resistance metal material 829 has been modified from that of Embodiment 1. Descriptions of structures, operations, and effects similar to those of Embodiment 1 will be omitted.

Figure 20:
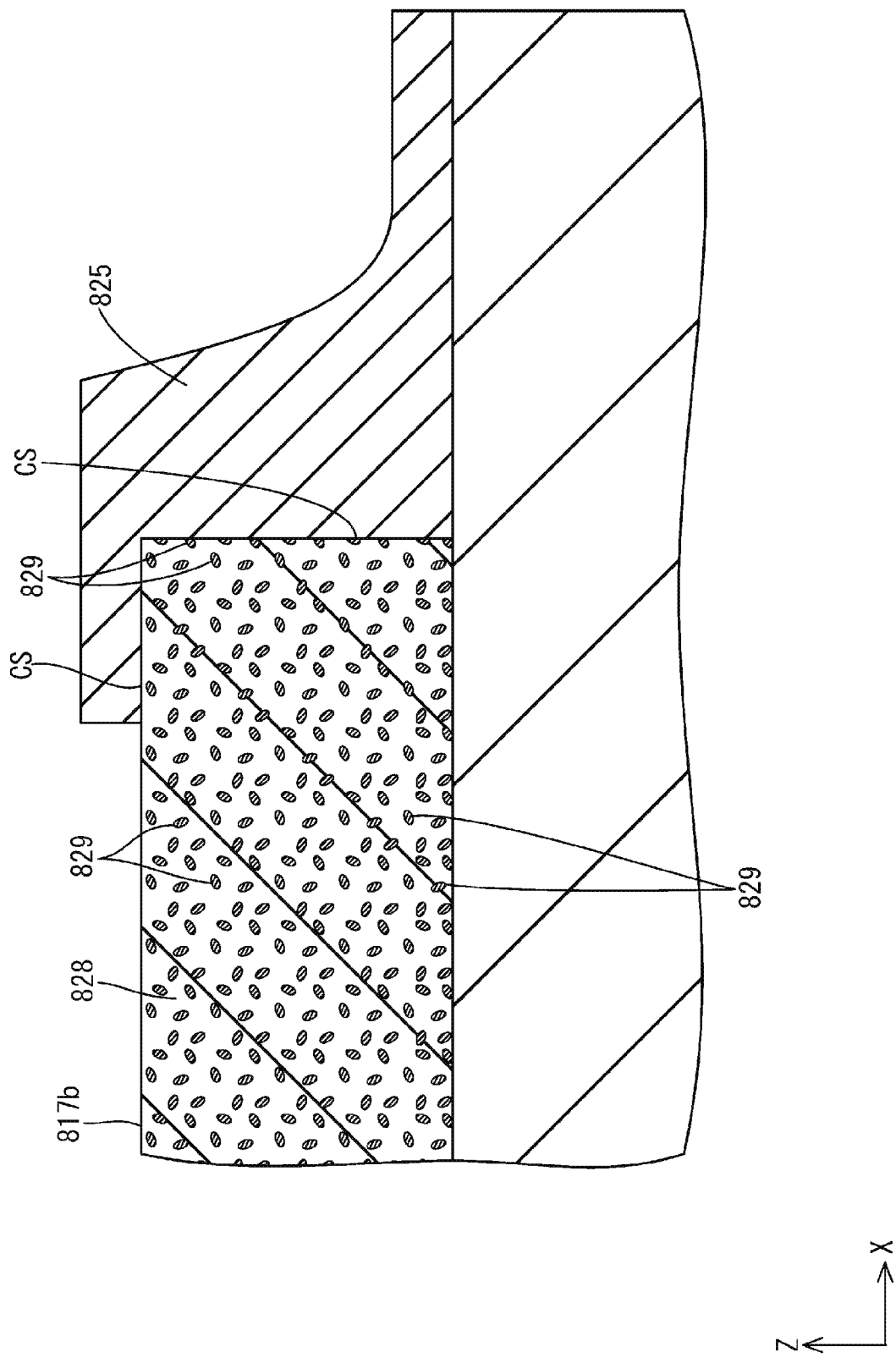
FIG. 20 is a cross-sectional view that shows respective contacting portions of an organic semiconductor film and a source electrode that form part of a TFT according to Embodiment 9 of the present invention.

As shown in FIG. 20, low-resistance metal material 829 according to the present embodiment has an elliptical sphere shape. A large amount of low-resistance metal material 829 with an elliptical sphere shape is randomly (irregularly) dispersed within a base metal material 828. Even in such a configuration, it is possible to cause the low-resistance metal material 829 to be suitably exposed at the contact surface CS, with an organic semiconductor film 825, of a source electrode 817b (drain electrode). Only the source electrode 817b is shown in FIG. 20; the drain electrode (not shown) has a configuration similar to that of the source electrode 817b, however.

Embodiment 10

Embodiment 10 of the present invention will be described using FIG. 21. In Embodiment 10, the shape of the low-resistance metal material 929 has been modified from that of Embodiment 1. Descriptions of structures, operations, and effects similar to those of Embodiment 1 will be omitted.

Figure 21:
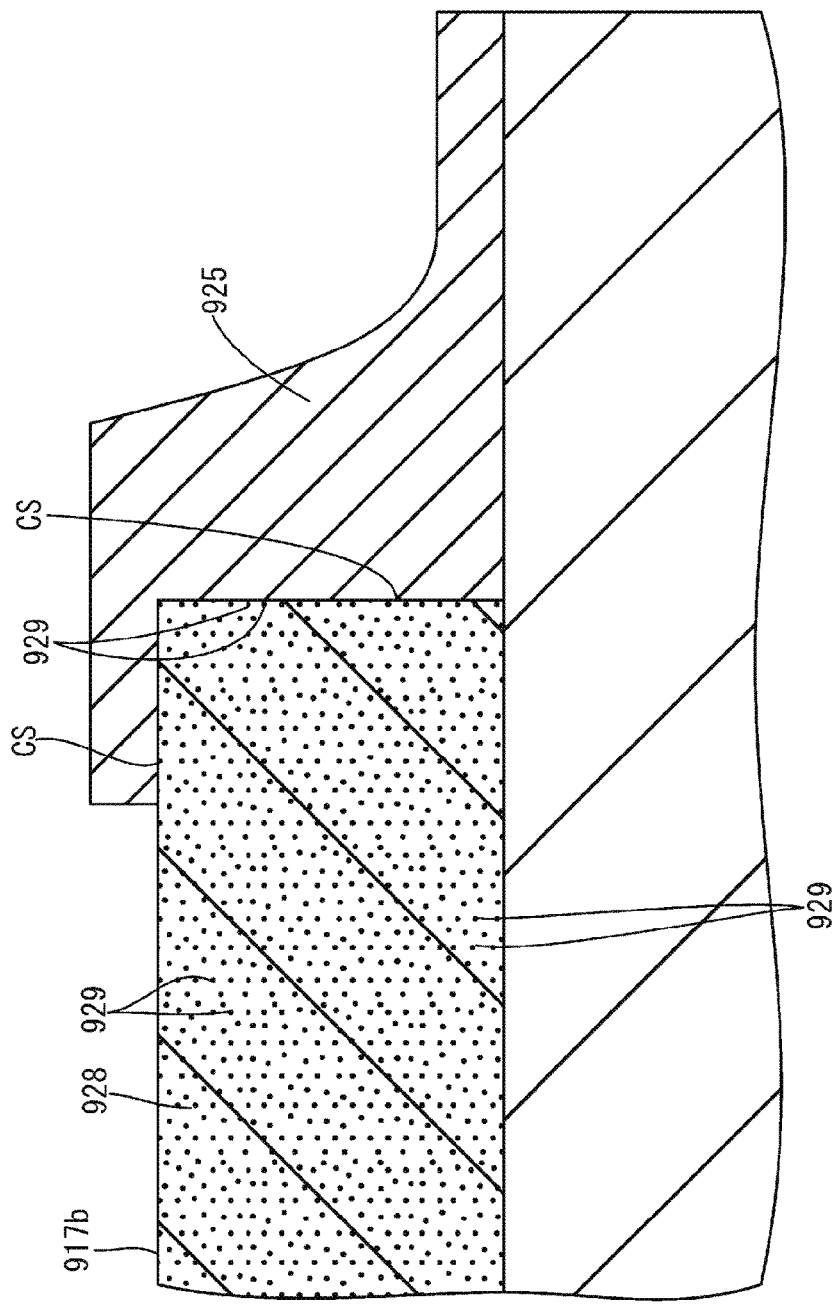
FIG. 21 is a cross-sectional view that shows respective contacting portions of an organic semiconductor film and a source electrode that form part of a TFT according to Embodiment 10 of the present invention.

As shown in FIG. 21, low-resistance metal material 929 according to the present embodiment has a particle-like shape. A large amount of particle-shaped low-resistance metal material 929 is randomly (irregularly) dispersed within a base metal material 928. Even in such a configuration, it is possible to cause the low-resistance metal material 929 to be suitably exposed at the contact surface CS, with an organic semiconductor film 925, of a source electrode 917b (drain electrode). Only the source electrode 917b is shown in FIG. 21; the drain electrode (not shown) has a configuration similar to that of the source electrode 917b, however.

Embodiment 11

Embodiment 11 of the present invention will be described using FIG. 22. In Embodiment 11, the shape of the low-resistance metal material 1029 has been modified from that of Embodiment 1. Descriptions of structures, operations, and effects similar to those of Embodiment 1 will be omitted.

Figure 22:
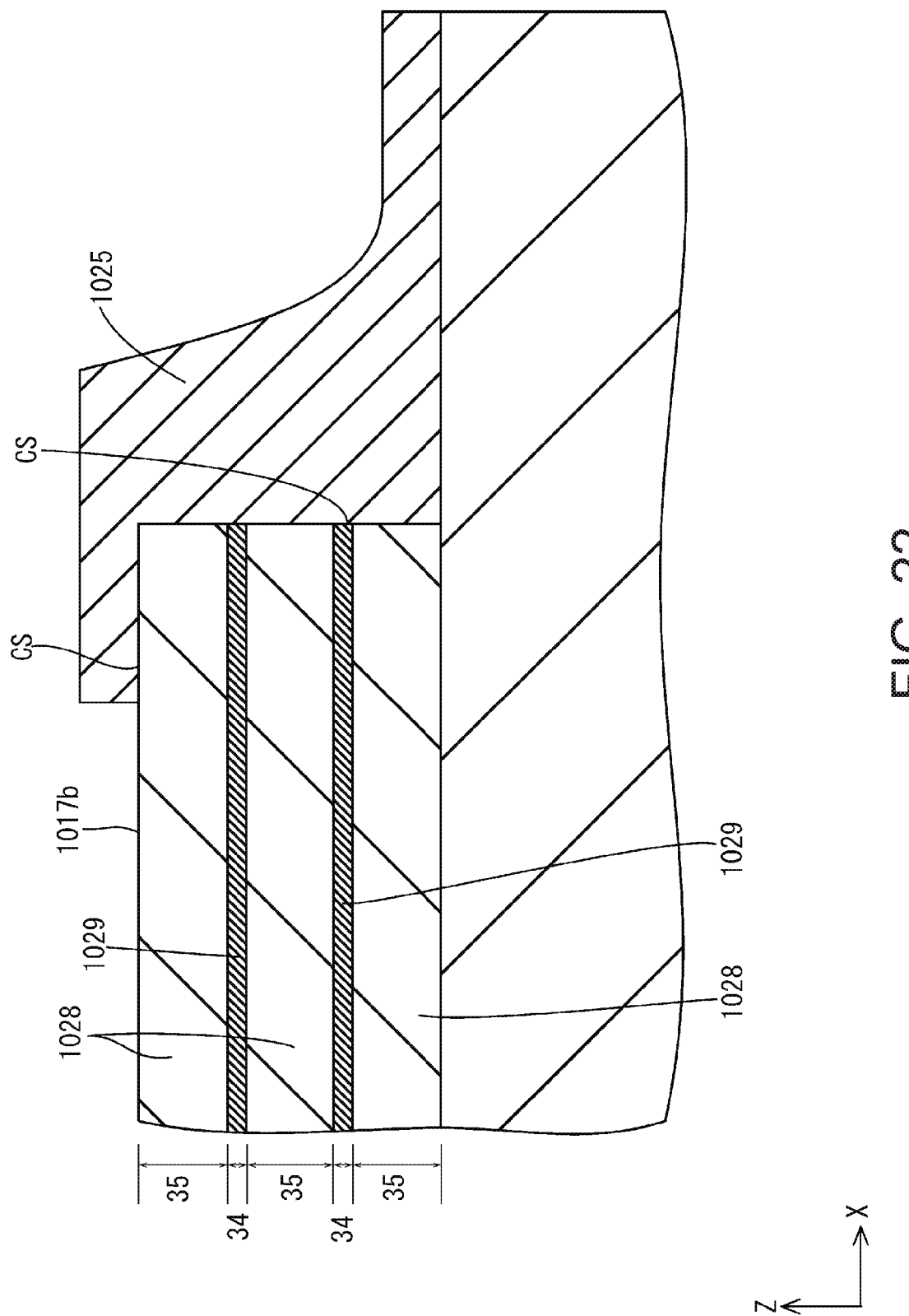
FIG. 22 is a cross-sectional view that shows respective contacting portions of an organic semiconductor film and a source electrode that form part of a TFT according to Embodiment 11 of the present invention.

As shown in FIG. 22, low-resistance metal material 1029 according to the present embodiment has a layer-like shape. In other words, a source electrode 1017b is formed by forming low-resistance metal layers 34 in which only low-resistance metal material 1029 is disposed, and base metal layers 35 in which only base metal material 1028 is disposed. The low-resistance metal layers 34 are formed of the low-resistance metal material 1029, and are layers that for the most part do not contain any base metal material 1028. Similarly, the base metal layers 35 are formed of the base metal material 1028, and are layers that for the most part do not contain any low-resistance metal material 1029. By using such a configuration, in the low-resistance metal layers 34 in the source electrode 1017b, an even larger number of metal pieces MP are exposed at the contact surface CS with the organic semiconductor film 1025 compared to Embodiments 3 and 4, and there is a further increase in the likelihood that a particular metal piece MP will be exposed compared to Embodiments 3 and 4. Therefore, it is possible to cause the low-resistance metal material 1029 to make better ohmic contact with the organic semiconductor film 1025. Only the source electrode 1017b is shown in FIG. 22; the drain electrode (not shown) has a configuration similar to that of the source electrode 1017b, however.

Other Embodiments

The present invention is not limited to the embodiments shown in the drawings and described above, and the following embodiments are also included in the technical scope of the present invention, for example.

Figure 23:
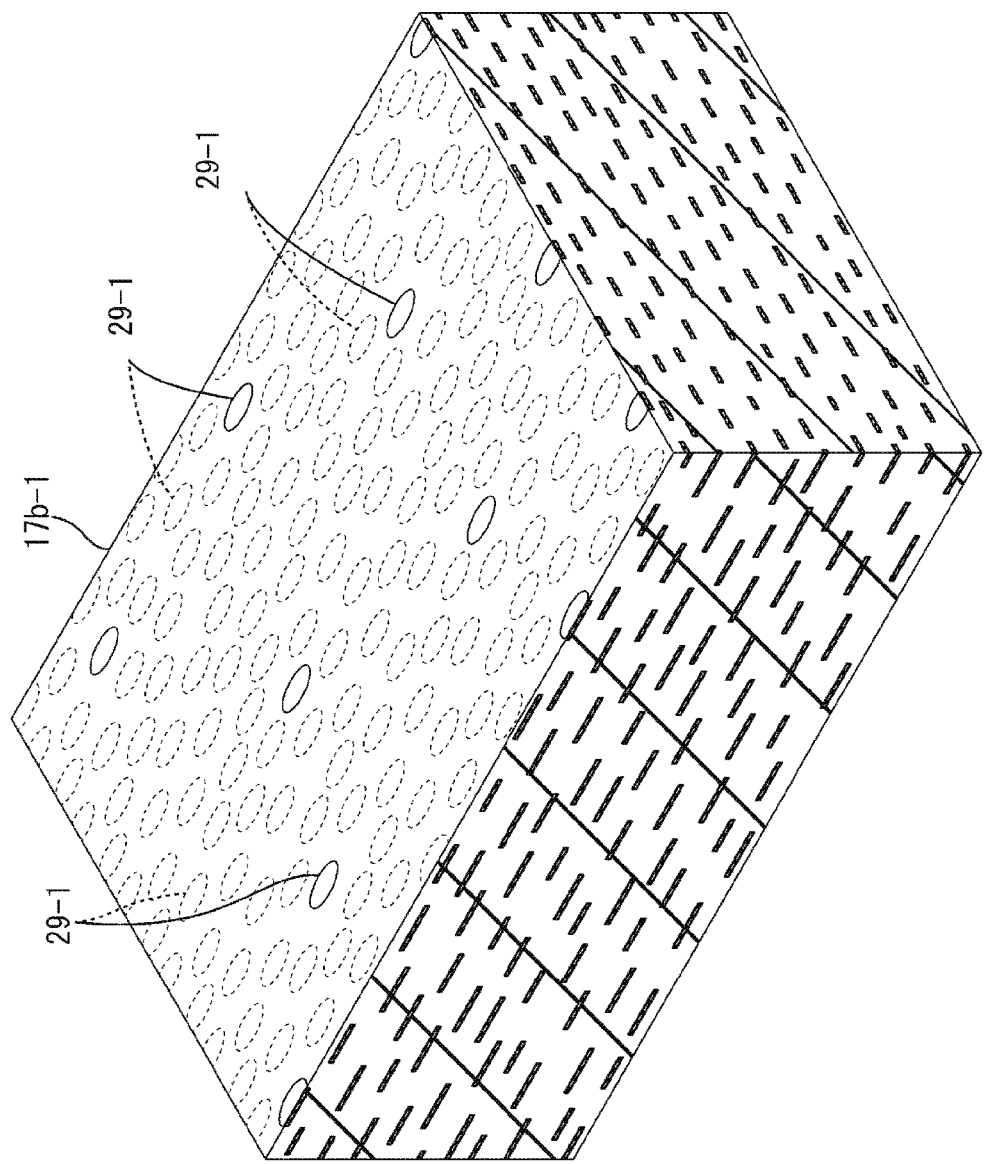
FIG. 23 is a perspective view of a source electrode forming a part of a TFT according to Other Embodiment (1).

(1) It is possible to modify the planar shape of the flat metal pieces of the low-resistance metal material so as to be different from Embodiment 1. Specifically, as shown in FIG. 23, it is possible to use a configuration in which flat metal pieces MP-1 of a low-resistance metal material 29-1 have a horizontally-long elliptical shape in a plan view. Only a source electrode 17b-1 is shown in FIG. 23; the drain electrode (not shown) has a configuration similar to that of the source electrode 17b-1, however.

(2) It is possible to appropriately modify the planar shape of the metal pieces of the low-resistance metal material so as to be different from Other Embodiment (1), and it is possible to use as the shape: a square, a triangle, a trapezoid, a diamond, a polygon having five or more sides, or the like, for example.

(3) In the respective above-mentioned embodiments, an example was used in which the low-resistance metal material was disposed so as to be exposed at any of the outer surfaces of the base metal film. It is possible, however, to use a configuration in which the low-resistance metal material is exposed at only specified outer surfaces from among the outer surfaces of the base metal film. In such a case, it is possible to use a configuration (a configuration in which the low-resistance metal material is not exposed at the non-contact surface) in which the low-resistance metal material is selectively exposed at only the portion of the outer surfaces of the base metal film that is a contact surface with the organic semiconductor film. Furthermore, it is possible to use a configuration in which the low-resistance metal material is selectively exposed at only a portion, such as the opposing end face, of the contact surface of the base metal film.

(4) It is possible to appropriately modify the specific content ratio of the low-resistance metal material so as to be different from that in the respective above-mentioned embodiments. In other words, it is possible to set the content ratio of the low-resistance metal material to less than or equal to 1%, or to greater than or equal to 30%.

(5) It is possible to appropriately modify the specific metal material of the low-resistance metal material so as to be from that in the respective above-mentioned embodiments. It is possible to use a noble metal such as ruthenium, rhodium, osmium, or iridium as the metal material of the low-resistance metal material, for example. In addition, it is possible use a substance that is not a noble metal as the metal material of the low-resistance metal material.

(6) It is possible to appropriately modify the specific metal material of the base metal material so as to be different from that in the respective above-mentioned embodiments. For example, it is possible to use, as the metal material of the base metal material, a transition metal that is a non-noble metal and that belongs to Groups 5 to 13 of the periodic table, for example. It is preferable to use, as the metal material used in the base metal material, a substance that has lower material costs than the metal material used in the low-resistance metal material. In such a case, it is also possible to use a noble metal as the metal material used in the base metal material. In addition, the metal material used in the base metal material may or not be a material that makes ohmic contact with the organic semiconductor film.

(7) It is possible to appropriately modify the specific materials used in the substrate, the first metal film, the organic semiconductor film, the gate insulating film, the planarizing film, and the transparent electrode film in the respective above-mentioned embodiments. It is possible to use a non-organic material such as a glass, silicon, or the like, as the material used in the substrate, for example. In addition, it is possible to use titanium nitride, tantalum nitride, or the like, as the metal material used in the first metal film. The resin material used in the gate insulating film may be a resin material that is not photosensitive. Furthermore, it is also possible to use a non-organic resin material as the resin material of the gate insulating film.

(8) It is possible to appropriately modify the specific film formation methods used for the various metal films, the organic semiconductor film, the gate insulating film, the planarizing film, and the transparent electrode film in the respective above-mentioned embodiments.

(9) An example was used in Embodiment 2 in which an organic resin material was used as the resin material in a protective film. It is possible, however, to use a non-organic resin material as the material in the protective film.

(10) In Embodiment 3, an example was used in which the thickness of a plurality of base metal-based layers was uniform, and in which the low-resistance metal-based layers were arranged with even gaps therebetween in the thickness direction. It is also possible, however, to use an arrangement in which the thicknesses of the plurality of base metal-based layers are different from each other and the low-resistance metal-based layers are irregularly arranged. It is also possible to make similar modifications to the configuration of Embodiment 11.

(11) It is possible to appropriately modify the number of base metal-based layers and low-resistance metal-based layers so as to be different from Embodiments 3 and 4. It is also possible to make similar modifications to the configuration of Embodiment 11.

(12) It is also possible to appropriately combine Embodiments 7 to 10 with the various configurations disclosed in Embodiments 2, 3, 4, and 6.

(13) It is also possible to appropriately combine Embodiments 2 to 4 with the configuration (a top-gate TFT) disclosed in Embodiment 5. In addition, it is also possible to appropriately combine Embodiments 7 to 10 with Embodiment 5.

(14) It is possible to appropriately modify the specific shape of the low-resistance metal material so as to be different from that in Embodiments 7 to 10. It is possible for the low-resistance material to have a cylindrical shape, a prism shape, a conical shape, a pyramid shape, or the like, for example.

(15) In the respective above-mentioned embodiments, an example was used in which the liquid crystal panel had a vertically-long quadrilateral shape. It is also possible to apply the present invention to a liquid crystal panel with a horizontally-long quadrilateral shape or a liquid crystal panel with a square shape, however.

(16) A configuration in which a functional panel such as a touch panel or a parallax barrier panel (a switching liquid crystal panel) is attached to the liquid crystal panel disclosed in the respective above-mentioned embodiments by being formed on the liquid crystal panel is also included in the present invention.

(17) In the above-mentioned respective embodiments, an example was used in which the liquid crystal display device included an edge-lit backlight device as a backlight device. The present invention also includes a display device that utilizes a direct-lit backlight device, however.

(18) In the above-mentioned respective embodiments, an example was used of a transmissive liquid crystal display device that included a backlight device as an external light source. The present invention can also be applied to a reflective liquid crystal display device that performs display by using external light. In such a case, the backlight device can be omitted.

(19) In the above-mentioned respective embodiments, a TFT was used as a switching element in a liquid crystal display device. However, the present invention can also be applied to a liquid crystal display device that utilizes a switching element other than a TFT (such as a thin film diode (TFD)), and can also be applied to a liquid crystal display device that performs black-white display in addition to a liquid crystal display device that performs color display.

(20) In the respective above-mentioned embodiments, an example was used in which the liquid crystal display device included a liquid crystal panel as a display panel. However, the present invention can also be applied to a display device that utilizes a different type of display panel (such as a PDP (plasma display panel), an organic EL panel, or an EPD (electrophoretic display panel)). In such a case, the backlight device can be omitted.

(21) In the respective above-mentioned embodiments, an example was used in which the liquid crystal panel was classified as small or medium-small and was utilized in various types of electronic devices such as portable information terminals, mobile phones, laptops, digital photo frames, portable gaming devices, or electronic ink paper, or the like. However, the present invention can also be applied to a liquid crystal panel that has a screen size of 20 inches to 90 inches, for example, and is classified as medium-sized or large (extra large). In such a case, the liquid crystal panel can be used in a television receiver, digital signage, an electronic blackboard, or the like.

DESCRIPTION OF REFERENCE CHARACTERS 11 liquid crystal panel (display device)
11a CF substrate (opposite substrate)
11b, 411b, 511b array substrate (substrate, device substrate)
11c liquid crystal layer
17, 417 TFT (semiconductor device, switching element)
17a, 417a gate electrode
17b, 117b, 217b, 317b, 417b, 517b, 617b, 717b, 817b, 917b, 1017b, 17b-1 source electrode (composite metal electrode)
17c, 117c, 417c, 517c drain electrode (composite metal electrode)
23, 123, 223, 423, 523 gate insulating film (insulating film)
25, 125, 225, 325, 425, 625, 725, 825, 925, 1025 organic semiconductor film
28, 228, 528, 628, 728, 828, 929, 1028 base metal material
28a opposing end face (end face)
29, 229, 529, 629, 729, 829, 929, 1029, 29-1 low-resistance metal material protective film
31, 331 low-resistance metal-based layer
32, 332 base metal-based layer adhesive film
CS contact surface
FS flat surface
MP metal piece
NCS non-contact surface

What is claimed is:

1. A semiconductor device, comprising:
an organic semiconductor film formed of an organic semiconductor material; and
composite metal electrodes that contact the organic semiconductor film,
wherein the composite metal electrodes are each made of a low-resistance metal material mixed with a base metal material, the low-resistance metal material making ohmic contact with the organic semiconductor film and having a contact resistance lower than that of said base metal material, the low-resistance metal material being exposed at least at a contact surface with the organic semiconductor film,
wherein the base metal material has a film shape, and at least an end face along a thickness direction thereof is said contact surface, and
wherein the low-resistance metal material is formed of a plurality of flat metal pieces contained within the base metal material, and said metal pieces are disposed such that a flat surface thereof is orthogonal to said end face.

2. The semiconductor device according to claim 1, wherein the composite metal electrodes are each configured such that the low-resistance metal material is also exposed at a non-contact surface that does not contact the organic semiconductor film.

3. The semiconductor device according to claim 1, wherein the composite metal electrodes are each formed by forming a low-resistance metal-based layer in which a relatively large amount of the low-resistance metal material is disposed, and a base metal-based layer in which a relatively large amount of the base metal material is disposed.

4. The semiconductor device according to claim 3, wherein at least a portion of the organic semiconductor film is formed on an underlying surface on which the composite metal electrodes are formed, a film thickness thereof being thinner than a thickness of the composite metal electrodes, and
wherein the composite metal electrodes are each configured such that the low-resistance metal-based layer is disposed along said underlying surface in a film thickness direction of the organic semiconductor film.

5. The semiconductor device according to claim 1, wherein the composite metal electrodes are each configured such that a content ratio of the low-resistance metal material is within a range of 1% to 30%.

6. The semiconductor device according to claim 1, further comprising:
a substrate;
a gate electrode formed on the substrate; and
an insulating film formed on a side of the gate electrode opposite to said substrate,
wherein the organic semiconductor film is formed on a side of the insulating film opposite to the substrate, and is disposed so as to coincide in position with the gate electrode, and
wherein the composite metal electrodes comprise a source electrode and a drain electrode that are disposed with a gap therebetween and that are formed on the side of the insulating film opposite to the substrate.

7. The semiconductor device according to claim 1, further comprising:
a substrate on which the organic semiconductor film and the composite metal electrodes are formed;
an insulating film formed on a side of the organic semiconductor film and the composite metal electrodes opposite to the substrate; and
a gate electrode formed on a side of the insulating film opposite to the substrate,
wherein the organic semiconductor film is disposed so as to coincide in position with the gate electrode, and
wherein the composite metal electrodes comprise a source electrode and a drain electrode that are disposed with a gap therebetween.

8. The semiconductor device according to claim 1, further comprising adhesive films respectively interposed between the composite metal electrodes and an underlying surface upon which the composite metal electrodes are formed, said adhesive films respectively adhering the composite metal electrodes to said underlying surface.

9. The semiconductor device according to claim 1,
wherein the organic semiconductor film comprises a portion formed on an underlying surface on which the composite metal electrodes are formed, and portions respectively formed on a side of each of the composite metal electrodes opposite to the underlying surface, and
wherein the semiconductor device further comprises a protective film formed on a side of the organic semiconductor film opposite to the underlying surface.

10. The semiconductor device according to claim 1, wherein the low-resistance metal material is any one of silver, gold, platinum, and palladium.

11. The semiconductor device according to claim 1, wherein the base metal material is any one of copper, aluminum, tungsten, molybdenum, cobalt, and nickel.

12. A display device, comprising:
a device substrate having as a switching element the semiconductor device according to claim 1.

13. The display device according to claim 12, further comprising:
an opposite substrate facing the device substrate; and a liquid crystal layer sandwiched between the device substrate and the opposite substrate.

14. A semiconductor device, comprising:

an organic semiconductor film formed of an organic semiconductor material; and composite metal electrodes that contact the organic semiconductor film, wherein the composite metal electrodes are each made of a low-resistance metal material mixed with a base metal material, the low-resistance metal material making ohmic contact with the organic semiconductor film and having a contact resistance lower than that of said base metal material, the low-resistance metal material being exposed at least at a contact surface with the organic semiconductor film, wherein the semiconductor device further comprises:

a substrate on which the organic semiconductor film and the composite metal electrodes are formed;

an insulating film formed on a side of the organic semiconductor film and the composite metal electrodes opposite to the substrate, the insulating film thereby being above the organic semiconductor film and the composite metal electrodes on the substrate; and a gate electrode formed on a side of the insulating film opposite to the substrate, the gate electrode being thereby above the insulating film, wherein the organic semiconductor film is disposed so as to coincide in position with the gate electrode, and wherein the composite metal electrodes comprise a source electrode and a drain electrode that are disposed with a gap therebetween.

15. A semiconductor device, comprising:

an organic semiconductor film formed of an organic semiconductor material; and composite metal electrodes that contact the organic semiconductor film, wherein the composite metal electrodes are each made of a low-resistance metal material mixed with a base metal material, the low-resistance metal material making ohmic contact with the organic semiconductor film and having a contact resistance lower than that of said base metal material, the low-resistance metal material being exposed at least at a contact surface with the organic semiconductor film, and wherein at the contact surface with the organic semiconductor film, the base metal material has a larger contact area to the organic semiconductor film than the low-resistance metal material, thereby constituting a main part of contact area with the organic semiconductor film.

* * * * *